United States Patent [19]
Burgoyne, Jr.

[11] Patent Number: 6,060,170
[45] Date of Patent: May 9, 2000

[54] FUNCTIONAL GROUPS FOR THERMAL CROSSLINKING OF POLYMERIC SYSTEMS

[75] Inventor: William Franklin Burgoyne, Jr., Allentown, Pa.

[73] Assignee: Air Products and Chemicals, Inc., Allentown, Pa.

[21] Appl. No.: 09/030,039

[22] Filed: Feb. 25, 1998

[51] Int. Cl.$^7$ .................................................. C08G 65/48
[52] U.S. Cl. ...................... 428/457; 428/458; 428/620; 428/626; 525/390; 525/420; 525/436; 525/534; 525/537; 525/540
[58] Field of Search ................................... 525/390, 534, 525/420, 436, 537, 540; 428/458, 457, 620, 626

[56] References Cited

U.S. PATENT DOCUMENTS

| | | | |
|---|---|---|---|
| 4,999,415 | 3/1991 | Guiver et al. | 528/171 |
| 5,114,780 | 5/1992 | Mercer et al. | 428/195 |
| 5,138,028 | 8/1992 | Paul et al. | 528/353 |
| 5,179,188 | 1/1993 | Mercer et al. | 528/219 |
| 5,658,994 | 8/1997 | Burgoyne, Jr. et al. | 525/390 |

FOREIGN PATENT DOCUMENTS

| | | | |
|---|---|---|---|
| 443352 | 1/1991 | European Pat. Off. | C08G 73/10 |
| 91/16370 | 10/1991 | WIPO | C08G 65/40 |
| 96/10812 | 1/1997 | WIPO | C08G 65/40 |
| 97/10193 | 3/1997 | WIPO | C07C 22/08 |

OTHER PUBLICATIONS

Hedberg, F.L.; Arnold, F.E.; *J. Polym. Sci. Polym. Chem. Ed.* (1976) 14, 2607–19.

Banihashemi, A.; Marvel, C.S.; *J. Polym. Sci., Polym. Chem. Ed.* (1977) 15, 2653–65.

Hergenrother, P.M.; *Macromolecules* (1981) 14, (4) 891–897.

Hergenrother, P.M.; *Macromolecules* (1981) 14, (4) 898–904.

Zhou, Q.; Swager, T.M.; *Polym. Preprint* (1993) 34(1), 193–4.

Guiver, Michael D.; Kutowy, O.; ApSimon, John W.; Functional Group Polysulphones By Bromination–metalation; Polymer, Jun. 1989, vol. 30, pp. 1137–1142.

Guiver, Michael, D.; Croteau, S.; Hazlett, John D.; Kutowy, O.; Synthesis and Characterization of Carboxylated Polysulfones; Bristish Polymer Journal; vol. 23; Nos. 1 & 2, 1990, pp. 29–39.

Yoshikawa, Masakazu; Hara, Hirohisa; Tanigaki, Masataka; Guiver, Michael; Matsuura, Takeshi; Modified Polysulphone Membranes: 1. Pervaporation of Water/Alcohol Mixtures Through Modified Polysulphone Membranes Having Methyl Ester Moiety; Polymer, 1992, vol. 33, No. 22, pp. 4805–4813.

Yoshikawa, Masakazu; Hara Hirohisa; Tanigaki, Masataka; Guiver, Michael; Matsuura, Takeshi; Modified Polysulphone Membranes: II. Pervaporation of Acqueous Ethanol Solutions Through Modified Polysulphone Membranes Bearing Various Hydroxyl Groups; Polymer Journal, 1992, vol. 24, No. 10, pp. 1049–1055.

Schraa, et al.,*J. Chem. Soc. Perkin Trans.* 2 (1994) 189–197.

*Primary Examiner*—Patricia A. Short
*Attorney, Agent, or Firm*—Geoffrey L. Chase

[57] ABSTRACT

This invention is a novel combination of crosslinking groups, which grafted to the backbone of thermally stable polymers, can be thermally induced to crosslink the polymers, affording a thermoset polymer system. This invention is particularly suited for high Tg polymers where the desired temperature for crosslinking reaction (cure) is in the range of 200–450° C. This invention utilizes a graft technique to attach various diarylhydroxymethyl and 9-(9-hydroxyfluorenyl) groups to poly(arylene ether) polymer backbone. Upon thermal treatment of the modified (grafted) polymer at temperatures of 200–450° C., crosslinking reactions take place, resulting in a thermoset polymer with increased Tg and elastic modulus above the Tg.

19 Claims, No Drawings

FUNCTIONAL GROUPS FOR THERMAL CROSSLINKING OF POLYMERIC SYSTEMS

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

The electronics industry has recently sought low dielectric materials, for use in fabricating very fine dimensioned integrated circuits, such as polymers may exhibit. However, the need for materials compatibility and dimensional stability over a wide range of conditions not only during ultimate end use, but also during further processing conditions leading to the finished integrated circuits, have presented a significant problem. The problem has been to make a polymeric thermoset system. This problem has been a very difficult one to solve, particularly for high Tg polymers where the desired temperature for reaction (cure) is in the range of 200–450° C.

Therefore, there is a need in the electronic fabrication industry for the replacement of silica-based, interlayer dielectric materials with materials of lower dielectric values. Silica and its modified versions have dielectric values on the order of 3.0 to 5.0 and usually 4.0 to 4.5. Polymeric materials used as replacements for silica as interlayer dielectric materials can have values for dielectric constant in the range of 1.9 to 3.5, which values are highly dependent on the structure of the polymeric materials. To successfully replace silica as an interlayer dielectric material, the properties of polymeric materials must conform to the rigid manufacturing requirements for integrated circuits or microchips in the electronic fabrication industry. Crosslinking has been recognized as one way to address the requirements of electronic materials polymers.

Past attempts utilized the phenylethynyl group as a site for crosslinking polymers. Various literature on the use of the phenylethynyl group for crosslinking polymeric materials exist, as set forth below.

Hedberg, F. L.; Arnold, F. E.; *J. Polym. Sci., Polym. Chem. Ed.* (1976) 14, 2607–19; and Banihashemi, A.; Marvel, C. S.; *J Polym. Sci., Polym. Chem. Ed.* (1977) 15, 2653–65, report the preparation of polyphenylquinoxalines with pendant phenylethynyl groups and their thermal cure via intramolecular cycloaddition and the heating of the 2,2'-di(phenylethynyl)biphenyl moiety to produce a 9-phenyldibenz[a,c]anthracene moiety, which enhances the Tg of the polymer.

Hergenrother, P. M.; *Macromolecules* (1981) 14, (4) 891–897; and Hergenrother, P. M.; *Macromolecules* (1981) 14, (4) 898–904 report on the preparation of poly (phenylquinoxalines) containing pendent phenylethynyl groups along the backbone, where these materials were prepared for evaluation as precursors for high thermally stable thermosets.

Paul, C. W.; Schulz, R. A.; Fenelli, S. P.; U.S. Pat. No. 5,138,028 (1992) and Paul, C. W.; Schulz, R. A.; Fenelli, S. P.; Eur. Pat. Appl. EP 443352 A2 910828 claim the preparation of polyimides, polyamic acids, polyamic acid esters, polyisoimides which are end-capped with diarylacetylenes. The cured products are used for encapsulation of electronic devices, as adhesives, and as moldings.

Babb, D. A.; Smith, D. W.; Martin, S. J.; Godshalx, J. P. WO 97/10193 discloses various multi-phenylethynyl compounds. These materials are claimed to be used for coating a wide variety of substrates such as dielectric coatings, computer chips.

Zhou, Q.; Swager, T. M.; *Polym. Preprint* (1993) 34(1), 193–4, reports the preparation of all carbon ladder polymers via cyclization reactions of acetylenes.

Mercer, F. W.; Goodman, T. D.; Lau, A. N. K.; Vo, L. P, U.S. Pat. No. 5,179,188 (1993) assigned to Raychem Corp, claims polymers (oligomers) of U.S. Pat. No. 5,114,780 (1992) which are end-capped with reactive groups having double and triple bonds.

Mercer, F. W.; Goodman, T. D.; Lau, A. N. K.; Vo, L. P., WO 91/16370 (1991) claim crosslinkable fluorinated aromatic ether compositions.

Lau, K; Hendricks, N.; Wan, W.; Smith, A.; PCT/US96/10812, report the preparation of phenylethynylated monomers for use in preparing polymers which can thermally crosslinked.

U.S. Pat. No. 5,658,994 to Burgoyne, Jr., et. al. discloses the utility of poly(arylene ethers) as low dielectric interlayers for the electronics industry where the poly(arylene ether) may be crosslinked either by crosslinking itself, through exposure to temperatures of greater than approximately 350° C., or by providing a crosslinking agent as well as end capping the polymer with known end cap agents, such as phenylethynyl, benzocyclobutene, ethynyl and nitrile.

Giuver, Michael D.; Kutowy, O.; ApSimon, John W.; Functional Group Polysulphones By Bromination-metalation; Polymer, June 1989, Vol 30, pp 1137–1142, describes the functionalization of polysulfones using n-butyllithium. Various functional groups were reacted, including methyl groups and benzophenone groups.

U.S. Pat. No. 4,999,415 to Guiver, et. al., discloses the functionalization of polysulfones with acetaldehyde, benzaldehyde, benzophenone, methylethylketone, phenylisocyanate, dimethyldisulfide, acetonitrile, benzonitrile, carbon dioxide, sulfur dioxide, deuterium oxide, methyl halides, allyl halides, benzyl halides, trimethylsilyl chloride, dimethylacetamide and iodine.

Guiver, Michael, D.; Croteau, S.; Hazlett, John D.; Kutowy, O.; Synthesis and Characterization of Carboxylated Polysulfones; British Polymer Journal; Vol 23; Nos 1 & 2, 1990, pp 29–39; describe the formation of carboxylated polysulfones by a lithiation/carboxylation modification procedure.

Yoshikawa, Masakazu; Hara, Hirohisa; Tanigaki, Masataka; Guiver, Michael; Matsuura, Takeshi; Modified Polysulphone Membranes: 1. Pervaporation of Water/Alcohol Mixtures Through Modified Polysulphone Membranes Having Methyl Ester Moiety; Polymer, 1992, Vol. 33, No. 22, pp 4805–4813; describe polysulphones modified with methyl carboxylates using lithiation and esterification reactions.

Yoshikawa, Masakazu; Hara, Hirohisa; Tanigaki, Masataka; Guiver, Michael; Matsuura, Takeshi; Modified Polysulphone Membranes: II. Pervaporation of Acqueous Ethanol Solutions Through Modified Polysulphone Membranes Bearing Various Hydroxyl Groups; Polymer Journal, 1992, Vol. 24, No. 10, pp 1049–1055; describe polysulphones modified with various aldehydes and ketones including benzophenone. Modification is conducted by lithiation using n-buyllithium.

Reactions of polysulphone under lithiation conditions are relatively favorable in comparison to poly(arylene ethers), as will be discussed with regard to the present invention below.

However, despite the art demonstrating various attempts to provide appropriate crosslinking of polymers for low dielectric interlayers, the art has still failed to solve the problem of thermally cured graft polymers with essentially no functional groups which have low dielectric constant and dimensional stability upon thermal crosslink as will be set forth with regard to the present invention.

BRIEF SUMMARY OF THE INVENTION

The present invention is a composition comprising a poly(arylene ether) polymer having a graft which graft can be thermally induced to crosslink the polymer, wherein said polymer having said graft has the structure:

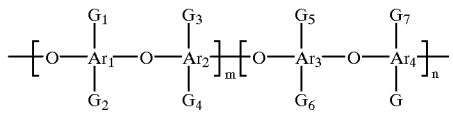

wherein m=0 to 1.0; and n=1.0-m; and $Ar_1$, $Ar_2$, $Ar_3$ and $Ar_4$ are individually arylene radicals, and $G_{1-8}$ are individually: H,

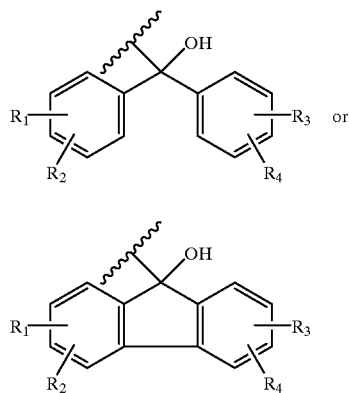

or mixtures thereof, wherein Z is the average number of G radicals which are I or II per repeating unit of said polymer and Z is in the range of 0.1 to 4.0, where $R_1$, $R_2$, $R_3$ and $R_4$ are individually H or alkoxy radical, wherein the alkoxy radical can have a normal or branched alkyl radical of $C_{1-8}$.

Preferably, the poly(arylene ether) polymer consists essentially of non-functional repeating units wherein $Ar_1$, $Ar_2$, $Ar_3$ and $Ar_4$ are individually arylene radicals selected from the group consisting of;

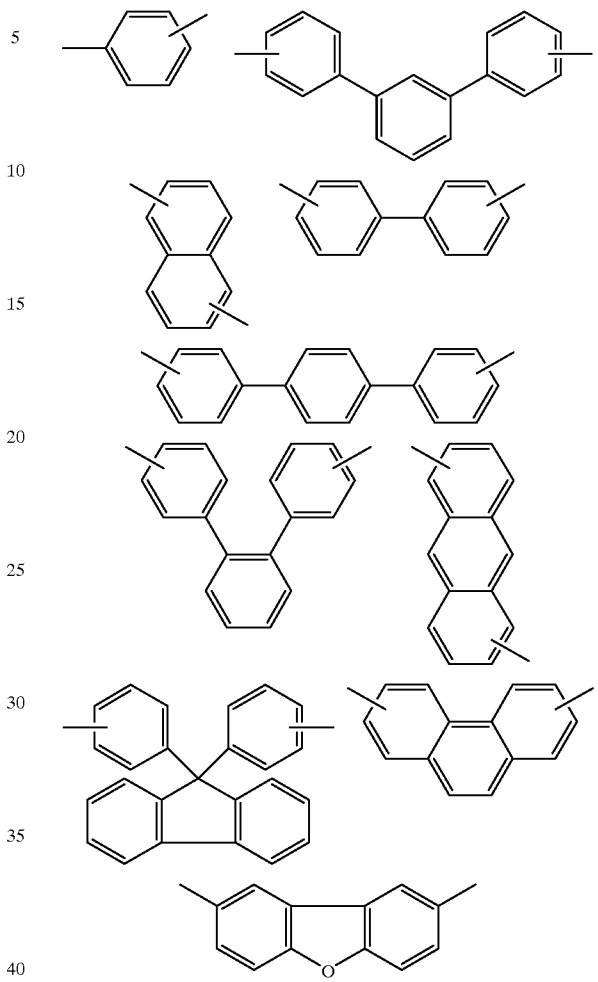

and mixtures thereof, but $Ar_1$ and $Ar_2$ or $Ar_3$ and $Ar_4$, other than the diradical 9,9-diphenylfluorene, are not isomeric equivalents.

More preferably, the grafted polymer has repeating units of a structure:

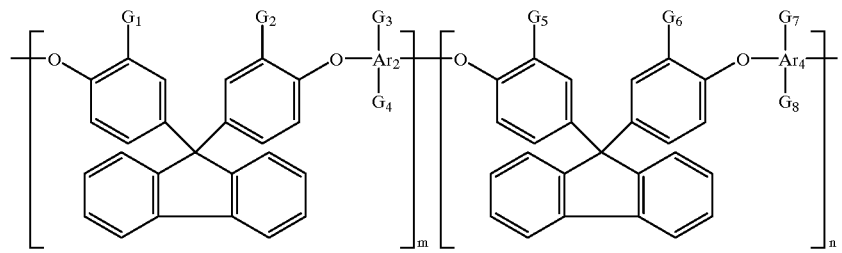

wherein $G_{1-8}$ are as defined above; m=0 to 1.0; and n=1.0-m; and $Ar_2$ and $Ar_4$ are individually arylene radicals selected from the group consisting of;
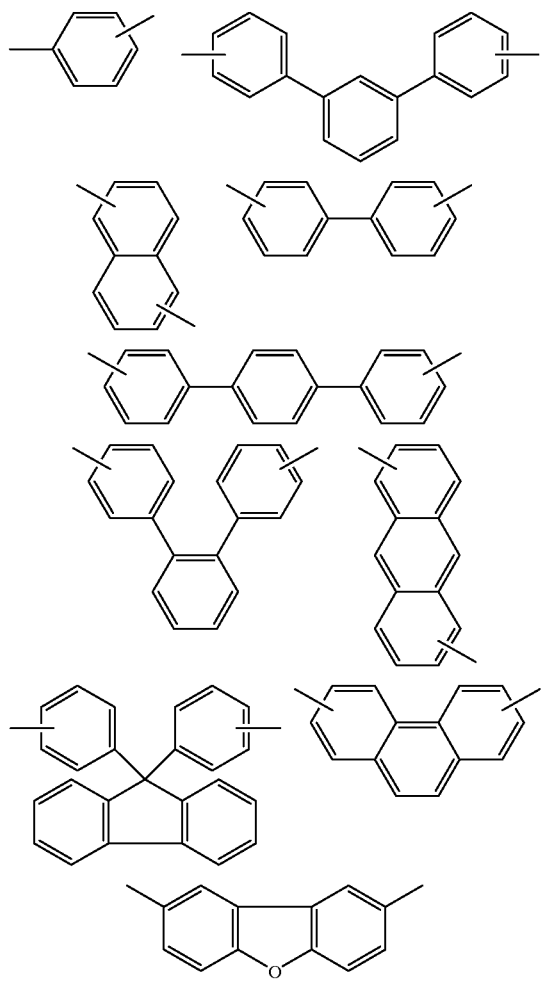
and mixtures thereof.
Still more preferably, the grafted polymer comprises a repeating polymer unit:
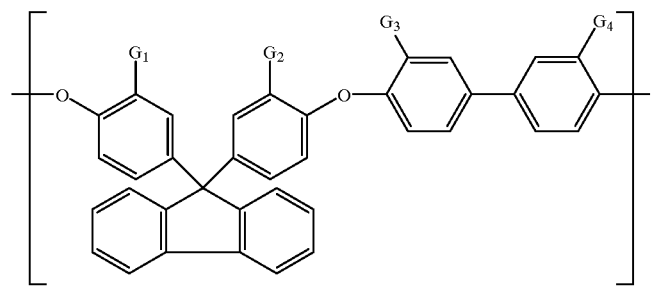
wherein grafts $G_{1-4}$ are individually selected from the group consisting of: H,
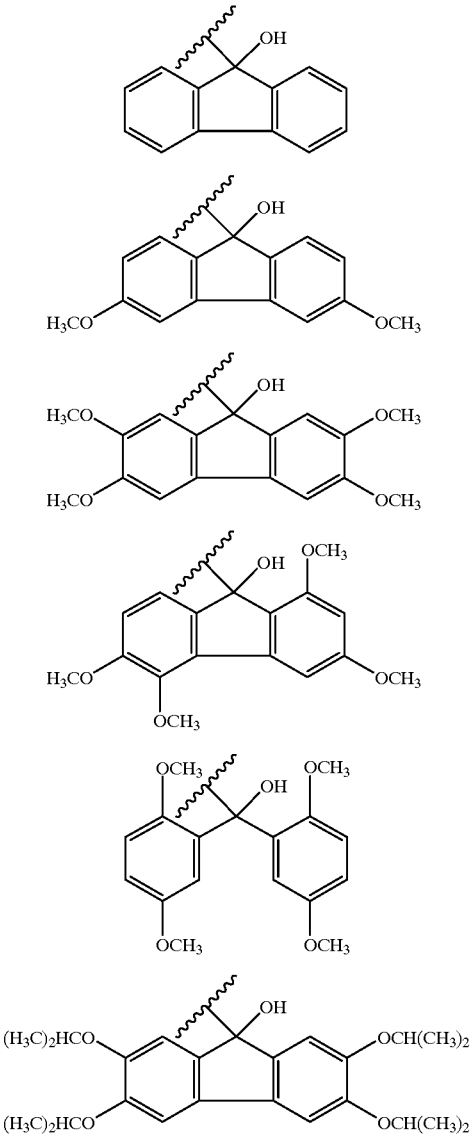

-continued

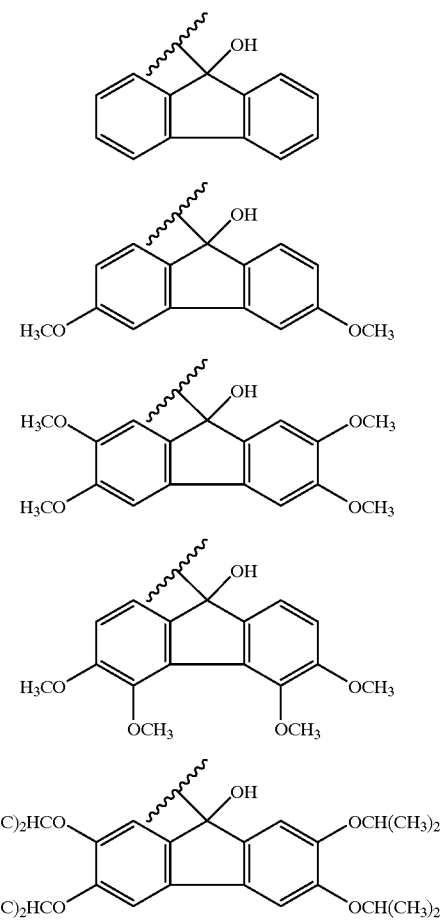

and mixtures thereof, where Z is the average number of G radicals per polymer unit and Z is in the range of 0.1 to 4.0.

Most preferably, the grafted polymer has a repeating polymer unit:

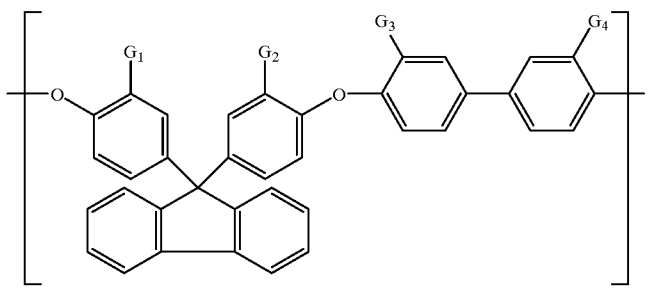

wherein $G_{1-4}$ are individually H or:

III

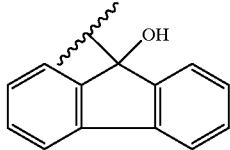

where Z is the average number of G radicals per polymer unit and Z is in the range of 0.1 to 4.0.

Preferably, Z is in the range of 0.25 to 1.5.

More preferably, Z is approximately 0.9.

Preferably, the composition comprises a dielectric material on a microelectronic device.

More preferably, the dielectric material is provided adjacent conductive regions of an integrated circuit.

Preferably, the polymer and the graft are crosslinked.

The present invention is also a method of crosslinking an aromatic polymer having a graft bonded to said aromatic polymer comprising heating the aromatic polymer having a graft bonded to the aromatic polymer to a temperature in the range of 200° C. to 450° C. in an inert atmosphere, and thermally inducing the aromatic polymer to crosslink, wherein the graft is selected from the group consisting of:

I

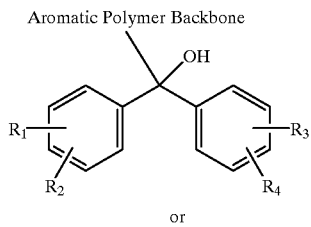

or

II

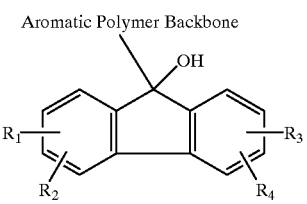

or mixtures thereof, where $R_1$, $R_2$, $R_3$ and $R_4$ are individually H or alkoxy radical, wherein the alkoxy radical can have a normal or branched alkyl radical of $C_{1-8}$.

Preferably, the graft is selected from the group consisting of:

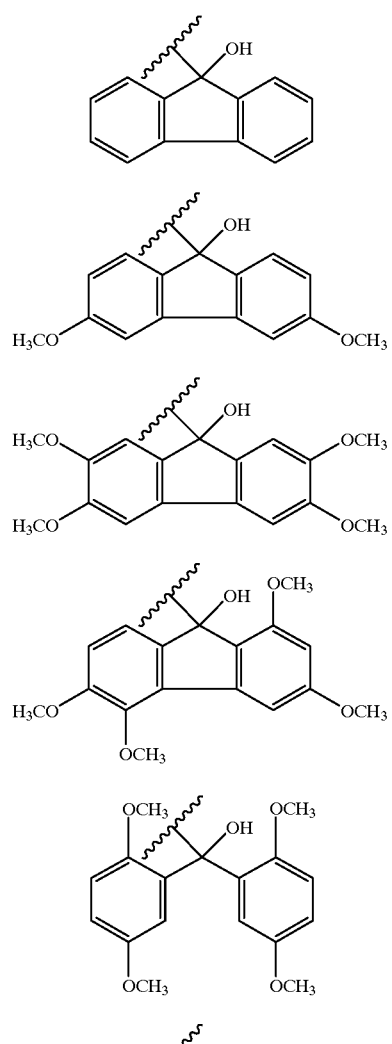

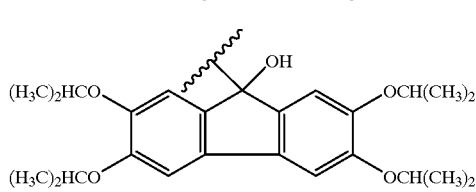

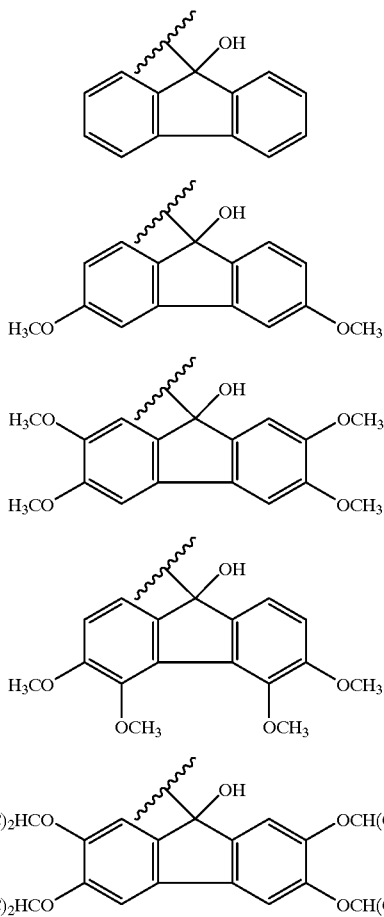

and mixtures thereof.

Preferably, the method of crosslinking can be performed on aromatic polymers selected from the group consisting of poly(arylene ethers), aromatic polysulfones, aromatic polyimides, aromatic polyamides, aromatic polyquinolines and mixtures thereof.

Preferably the crosslink temperature is in the range of 300° C. to 450° C.

More preferably the crosslink temperature is approximately 425° C.

The present invention is also a method of synthesizing a graft aromatic polymer comprising contacting a poly(arylene ether) polymer with tertiary alkyl lithium in an appropriate solvent at a temperature in the range of −40° C. to −10° C. and adding a ketone at a temperature in the range of −10° C. to 25° C., where the ketone is selected from the group consisting of:

I

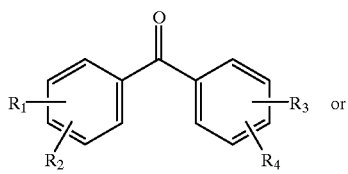

or

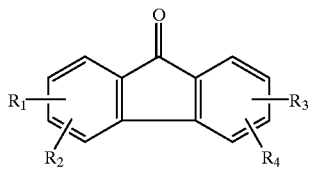

or mixtures thereof, where $R_1$, $R_2$, $R_3$ and $R_4$ are individually H or alkoxy radicals, wherein the alkoxy radical is a normal or branched alkyl radical of $C_{1-8}$.

Preferably, the ketone is selected from the group consisting of:

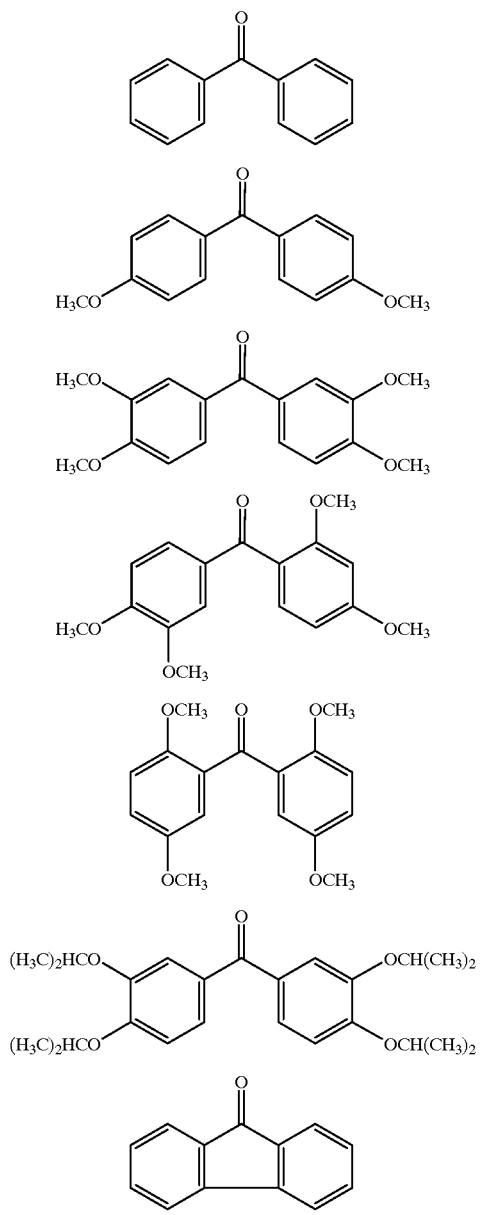

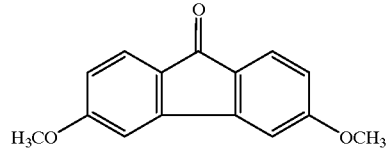

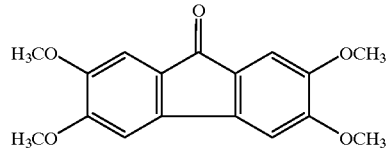

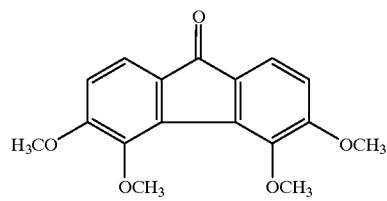

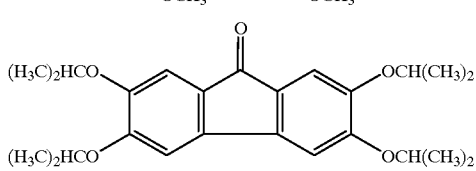

and mixtures thereof.

Preferably, after the addition of the ketone the mixture is acidified and the grafted polymer is recovered.

Preferably, the tertiary alkyl lithium is tert-butyllithium.

Preferably, the solvent is selected from the group consisting of tetrahydrofuran, glyme, ethyl ether, butyl ethyl ether, tert-butyl methyl ether, 2-methoxyethyl ether, di(ethylene glycol)diethyl ether and mixtures thereof.

BRIEF DESCRIPTION OF SEVERAL VIEWS OF THE DRAWINGS

Not Applicable

DETAILED DESCRIPTION OF THE INVENTION

As interconnect dimensions in integrated circuits shrink well below one-half micron, traditional interlayer dielectrics, with their relatively high dielectric constants, provide unacceptable levels of capacitance in interconnects. There is a need in the integrated circuit (IC) industry for the replacement of silica based, interlayer dielectric (ILD) materials with materials of lower dielectric (∈) values. Silica and its modified versions have e values on the order of 3.0–5.0 (usually 4.0–4.5).

Organic polymers are, in general, known to exhibit significantly lower dielectric constants than inorganic oxides and nitrides, and thus may be considered as candidates for the intermetal dielectric in future integrated circuits. However, the challenges associated with integrating organic polymers are significant. For example, the thermal and thermal-oxidative stability of most organic polymers is far too low to allow integration, given current typical back-end-of-the-line process temperatures. Some classes of polymers, notably polyimides and other polymers based largely or exclusively on aromatic linking groups, appear to exhibit sufficient thermal stability to withstand current back end processing temperatures. Additional key requirements in polymer dielectric candidates include (a) low dielectric constants to provide significant reductions in capacitance, and (b) extremely low levels of adsorption and/or outgassing of moisture during thermal processing.

Polymeric materials can have $\epsilon$ values in the range of 1.9–3.5, which is highly dependent on the structure. The present invention provides a new crosslinking graft for aromatic polymers to achieve the necessary chemical and physical properties for this application and other applications, such as multichip module packaging, encapsulation and flat panel display. The crosslinked graft aromatic polymers of the present invention exhibit an excellent combination of thermal stability, low dielectric constant, low moisture absorption and low moisture outgassing. In order to replace silica as an ILD, the properties of the polymeric material must conform to the rigid manufacturing requirements for microchips. Table 1 summarizes the requirements set by IC manufacturers.

TABLE 1

| Summary of Low $\epsilon$, ILD Requirements Set by IC Manufacturers | |
| --- | --- |
| * Thermal Stability | Must have thermal stability >400° C. in vacuum or forming gas ($N_2$ with 4% $H_2$). CVD Tungsten Deposition: 400–480° C. CVD Copper Deposition: 250–275° C. |
| * Dielectric Constant | Below 3.0, preferably 2.7 or lower. |
| * Moisture Absorption | Less than 0.5 wt %. |
| * Isotropic Dielectric Const. | No anisotropy. Perpendicular and parallel dielectric constants must be the same and uniform across the wafer. |
| * High Tg | Greater than 400° C. or greater than 300° C. with high degree of crosslinking. |
| * Adhesion to Cu, Al, $SiO_2$ and Si | This is a must but adhesion promoters can be used. |
| * Low stress | Optimum CTE (coefficient of thermal expansion) would be the same as for $SiO_2$. |
| * Must be patternable | Should be directionally etchable by RIE (reactive ion etching). |
| * Chemical Compatibility | No reactivity with metals (i.e. possible reaction between Al lines and fluorinated polymers at elevated temperatures; Solubility of Cu in some polymers) |
| * No solvent absorption | No swelling due to photoresist solvents. |
| * Compatibility with CMP (chemical-mechanical polishing) | Necessary if Damacene process used. |

The present invention is a composite grafted aromatic polymer of: (1) a crosslinking group or graft with or without additional reactive substituents, such as alkoxy groups (e.g. —$OCH_3$)), where the alkyl group can be $C_{1-8}$, and (2) an aromatic polymer backbone. The specific types of groups which lend themselves to thermally induced curing are illustrated below for the two generic groups which constitute the first part (1) of the composite polymer of the present invention.

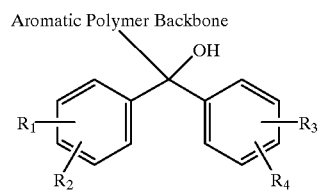

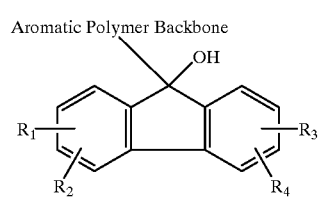

and mixtures thereof, where $R_1$, $R_2$, $R_3$ and $R_4$ are individually H or alkoxy radical. The alkoxy can have a carbon chain of $C_{1-8}$, normal or branched. The following is the general reaction for preparing grafted, aromatic polymeric structures, such as poly(arylene ethers):

1) Lithiation with an alkyl lithium such as t-BuLi
2) Addition of a substituted Aromatic Ketone such as

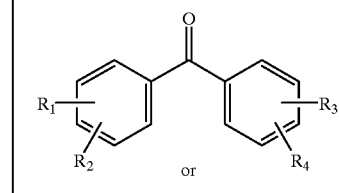

or

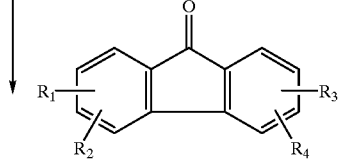

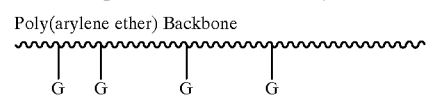

where G =

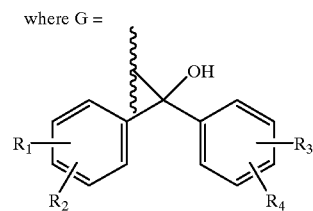

or

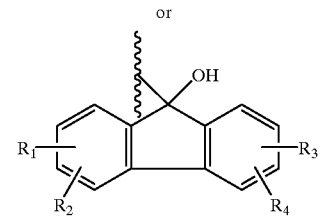

For use as low dielectric material for microchip manufacture, it is highly desirable to graft a thermally induced crosslinking group onto a poly(arylene ether). Such poly(arylene ethers) and their use in dielectric devices is set forth in U.S. Pat. No. 5,658,994 which is incorporated herein by reference in its entirety.

Poly(arylene ether) polymer comprising repeating units of the structure:

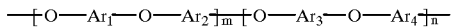

wherein m=0 to 1.0; and n=1.0−m.

The monomers $Ar_1$, $Ar_2$, $Ar_3$ and/or $Ar_4$, which represent one or more aromatic ring structures can be selected from the following structures (in the dihalogenated form, $Ar_2$ and $Ar_4$, or the dihydroxy form, $Ar_1$ and $Ar_3$, prior to polymerization, preferably the dibrominated form for the dihalogenated form and preferably the potassium, sodium or lithium form for the dihydroxy, respectively, wherein the mix of monomers is such that a dihalogenated monomer, $Ar_2$ and/or $Ar_4$, and a dihydroxy monomer, $Ar_1$ and/or $Ar_3$, are selected for co-etherification in the Ullman condensation; and $Ar_1$, $Ar_2$, $Ar_3$ and $Ar_4$ together cannot be isomeric equivalents unless compound I is present, because of crystallization problems, but subsets of less than all the Ar structures can be isomeric equivalents):

A-phenylene:

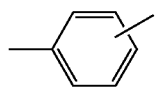

B-biphenyl diradical:

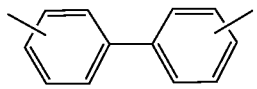

C-para-terphenyl diradical:

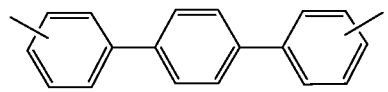

D-meta-terphenyl diradical:

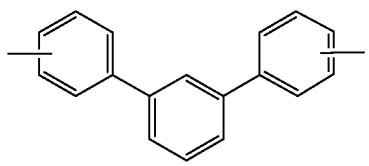

E-ortho-terphenyl diradical:

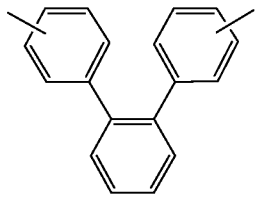

F-naphthalene diradical:

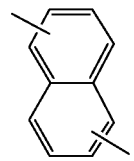

G-anthracene diradical:

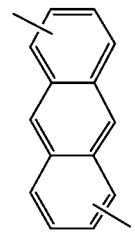

H-phenanthrene diradical:

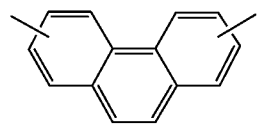

I-diradical of 9,9-diphenylfluorene of the type:

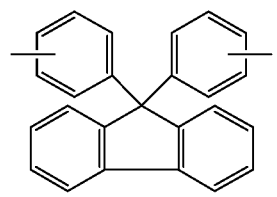

J-4,4'-diradical of dibenzofuran:

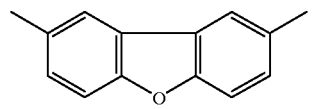

Preferably, the polymers which are grafted in accordance with the present invention are non-functional, other than the presence of the graft, in that they are chemically inert and they do not bear any functional groups that are detrimental to their application in the fabrication of microelectronic devices. They do not have carbonyl moieties such as amide, imide, and ketone, which promote adsorption of water. They do not bear halogens such as fluorine, chlorine, bromine, and iodine which can react with metal sources in metal deposition processes. They are composed of essentially aromatic carbons, except for the bridging carbon in the 9,9-fluorenylidene group, which has much of the character of aromatic carbons due to its proximity to aromatic structures. For purposes of the present invention, that carbon is deemed to be a perphenylated carbon. In the case of non-functional poly(arylene ether) polymers, they do not have bridging groups other than the ether linkage, and more specifically they do not have sulfur linkages.

Specific example of this grafting process for grafting a poly(arylene ether) is as follows:

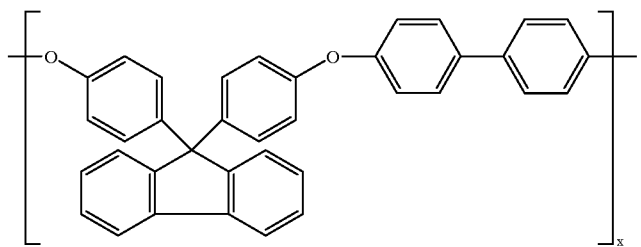

1) tert-butyllithium
   tetrahydrofuran (THF)
   -40 to -10 C.
2) 3,3',4,4'-tetramethoxybenzophenone
   -10 to 25 C.
3) acetic acid

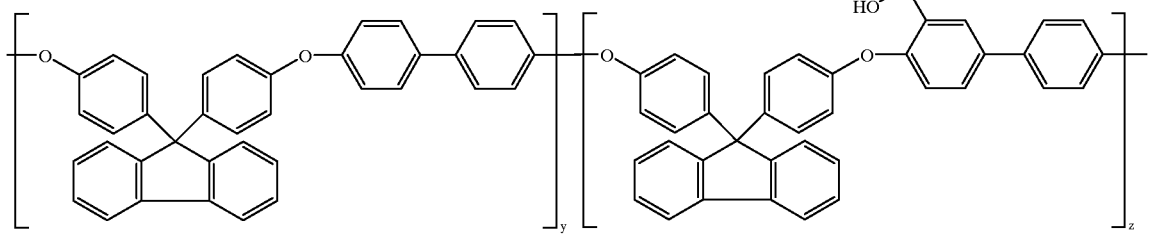

The solvent is selected from the group consisting of tetrahydrofuran, glyme, ethyl ether, butyl ethyl ether, tert-butyl methyl ether, 2-methoxyethyl ether, di(ethylene glycol)diethyl ether and mixtures thereof.

Some examples (not inclusive) of specific ketones which can be grafted onto aromatic polymers and lend themselves to thermally induced crosslinking are as follows:

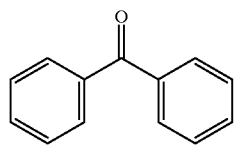

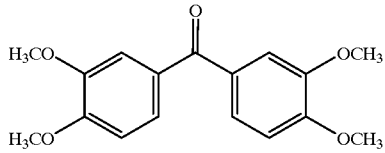

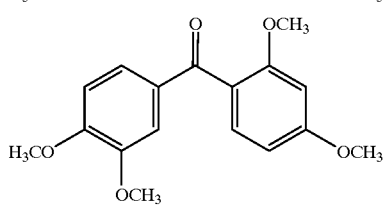

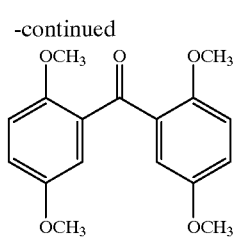

-continued

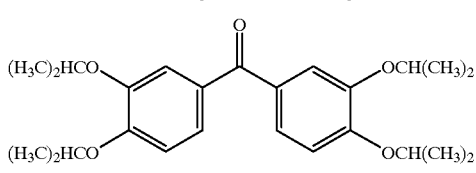

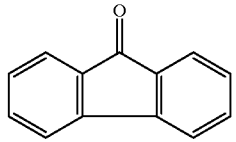

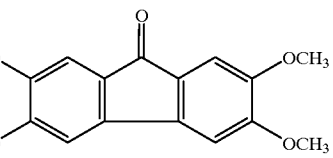

-continued

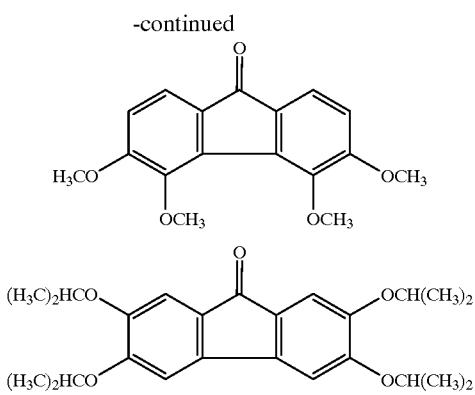

Not to be bound by theory, there are several mechanisms by which the thermal induced crosslinking can occur. These can be visualized as follows:

First Stage of Thermally Induced Crosslinking Reaction

The first stage of thermally induced reaction (cure) involves a condensation reaction which involves the loss of water. This reaction occurs in the temperature range of 200–260° C. The reaction can occur intramolecularly, resulting in no crosslinking. However, it can also occur intermolecularly so that a crosslink is formed as shown below:

Second Stage of Thermally Induced Crosslinking Reaction

With appropriate substituents present on the grafted crosslinker, secondary crosslinking can also occur. These reactions generally occur at temperatures of 300–450° C. Below are some examples.

With para-methoxy groups on the graft (one on each aromatic ring of the graft), the secondary stage of thermally induced crosslinking can be done in two different ways. In air (oxygen) at 350–400° C., the para-methoxyphenyl groups oxidize to ortho-benzoquinone type groups. At these temperatures, the ortho-benzoquinone groups react quickly with other polymeric chains in order to form crosslinks. In an inert gas, such as nitrogen, at 425–450° C., methanol is lost and benzyne type appendages are formed. These appendages react quickly with other polymeric chains in order to form crosslinks. If there are two methoxy groups, (ortho or para to each other) on each ring, the ortho-benzoquinone type group can be formed without the need for air (oxygen) and will undergo similar crosslinking. Similar, thermally induced transformations of dialkoxybenzenes to benzoquinone type structures have been reported by Schraa, et. al., *J. Chem. Soc. Perkin Trans.* 2 (1994) 189–197. However, they do not recognize the potential for use of this type of transformation in generating a moiety which can undergo subsequent condensation reactions.

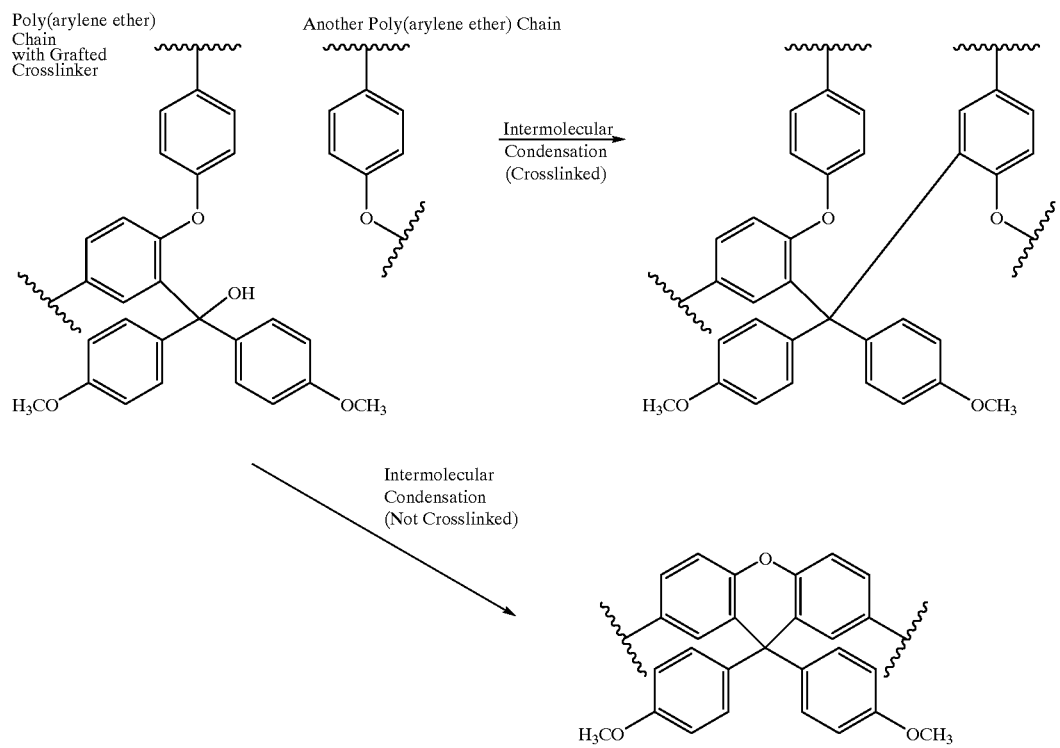

Polymeric Poly(arylene ether) with Crosslinking Graft after First Stage of Cure

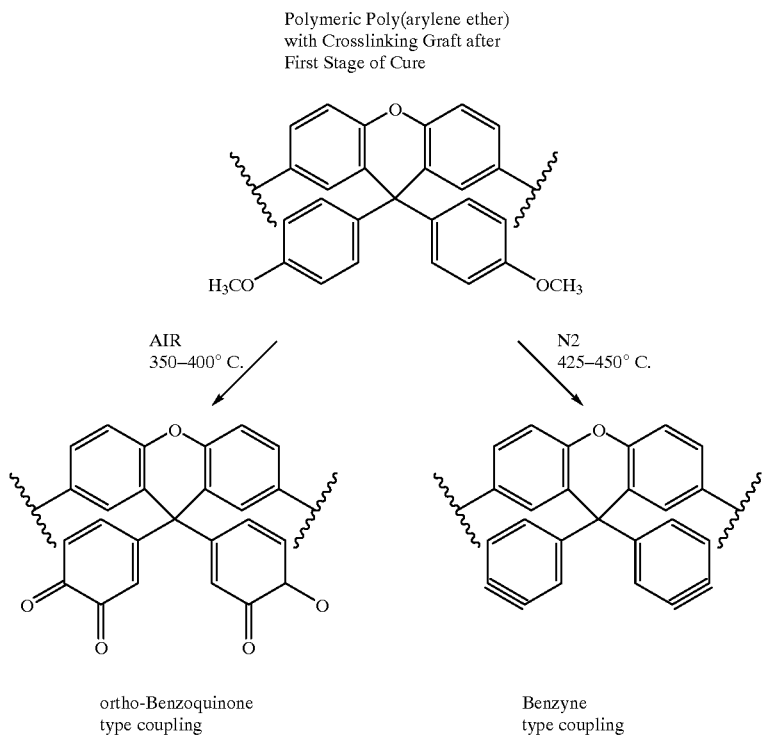

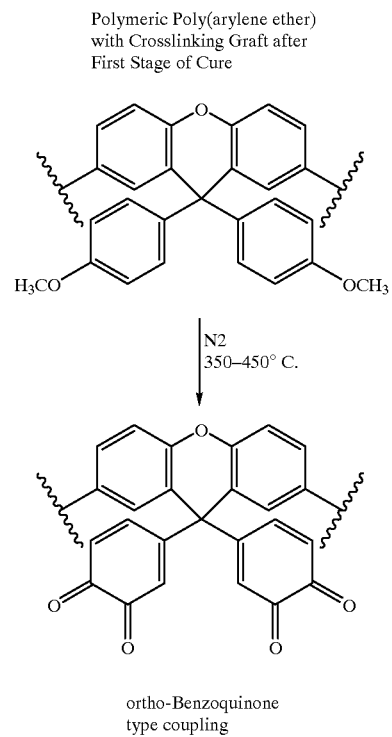

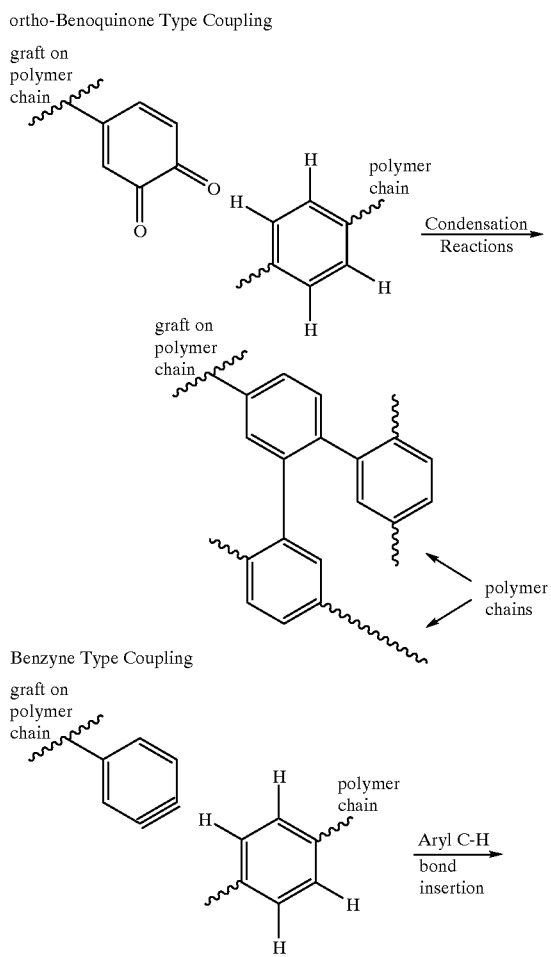

-continued

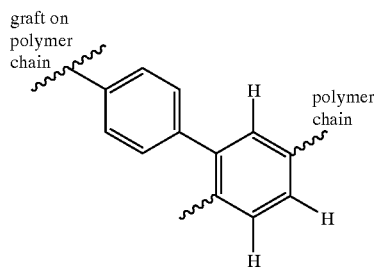

EXAMPLE 1

Preparation of Poly(arylene ether)

A mixture of 35.0421 g (0.1000 mol) of 9,9-bis(4-hydroxyphenyl)fluorene, 75 g of toluene, and 100 g of benzophenone was charged to a 500 mL, 3-necked, round-bottomed flask fitted with a Dean-Stark trap, condenser, nitrogen inlet, mechanical stirrer, and thermometer. The mixture was heated to 60° C. with stirring and a nitrogen atmosphere. After homogeneity had been reached, 16.000 g of a 50.00 wt % aqueous solution of sodium hydroxide (0.2000 mol of sodium hydroxide) was slowly added over 10 min. The reaction mixture was heated to ca. 140° C. and the water azeotrope was collected. After 4 hr. and complete dehydration was ensured, the temperature of the reaction mixture was increased to 200° C. and the toluene was removed via distillation. The reaction mixture was cooled to 80° C. and 31.202 g (0.1000 mol) of 4,4'-dibromobiphenyl was added. The reaction mixture was then heated to 200° C. A 10 mL portion of a copper (I) chloride/quinoline solution (containing 0.10 g of copper (I) chloride, 1.00 mmol) was added and reaction mixture was maintained at 200° C. for 48 hr. The reaction mixture was cooled to 100° C., and 200 g of toluene was added. The reaction mixture was then quenched in a rapidly stirred solution of 25 g of acetic acid in 1000 g of methanol. The precipitate was isolated and placed in 2 L of boiling water for 8 hr. The precipitate was first dried in an oven (100° C.) then dissolved in 300 g of tetrahydrofuran. The polymer solution was filtered then precipitated in 1 L of methanol. The precipitate was collected, washed with methanol, then dried in a vacuum oven (100° C.) overnight.

This procedure afforded 42 g of polymer which possessed the following properties: Molecular weight (by GPC): Mw=65,300; Mn, 20,700; d=3.16; Tg (by DSC): 257° C.; Thermal stability (by TGA, isothermal weight loss at 400° C.): <0.1 wt % loss/hr. "X" can range from very low molecular weights to high weights depending on the desired utility, such as gap filling capability.

The polymer repeat structure is illustrated as follows:

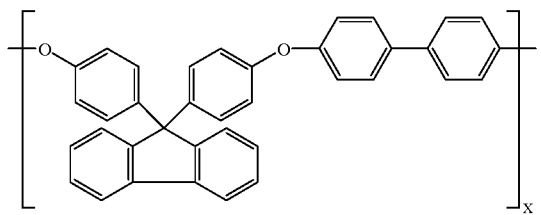

Although the polymer can have almost any molecular weight based upon desired end use properties, it is possible for X to be in the range of approximately 5 to 10,000.

EXAMPLE 2

Grafting Benzophenone onto Polysulfone (Commercial Udel P-3500)

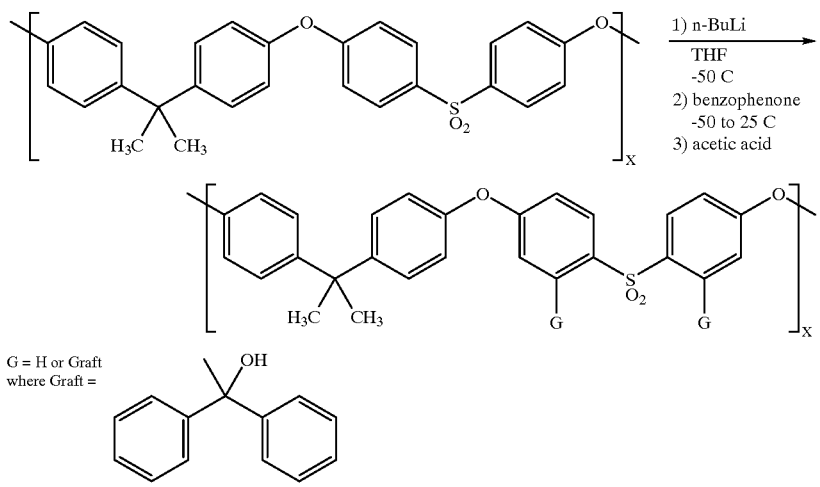

In a 500 mL, three-necked, round-bottomed flask fitted with a mechanical stirrer, nitrogen inlet, and addition funnel, 10.00 g (0.0226 mol of polymer repeat unit) of polysulfone (commercial Udel P-3500 polysulfone) was dissolved in 200 mL of anhydrous tetrahydrofuran with stirring. The solution was cooled to −50° C. with the aid of a carbon dioxide/acetone bath. With vigorous stirring, 4.52 mL (0.0113 mol) of 2.5 M n-butyllithium in mixed hexanes was added over a 5 minute period. The solution turned from a clear, light yellow colored solution to a deep brownish-red colored solution. After 30 minute, 2.28 g (0.0125 mol) of benzophenone was added. The cooling bath was removed and the solution was gradually warmed to 20° C. over 30 minutes. After maintaining the reaction mixture at this temperature for 2 hr. with stirring, the reaction mixture was poured into a mixture of 600 mL of isopropanol and 300 mL of water, and 20 mL of acetic acid. After isolation of the precipitate and drying the precipitate in a vacuum oven set at 80° C., isolated 11.54 g of polysulfone polymer bearing diphenylhydroxymethyl groups ortho to the sulfone moiety of the polymer. NMR analysis of the polymer revealed that there were 0.25 grafts per polymer repeat unit where the graft was the diphenylhydroxymethyl group. "X" can vary over a wide range.

EXAMPLE 3
Grafting 9-Fluorenone onto Polysulfone (Commercial Udel P-3500 Polymer)

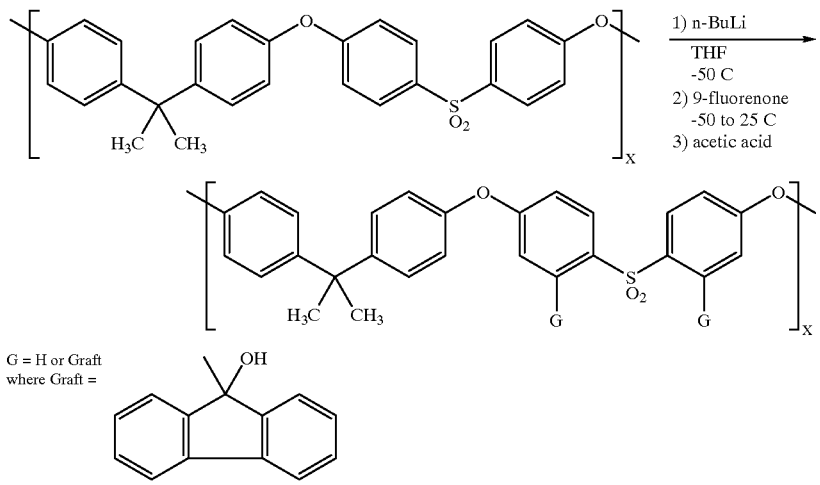

The procedure of Example 2 was followed except that 9-fluorenone was used instead of benzophenone. Therefore, the graft placed on the polysulfone was the 9-(9-hydroxyfluorenyl) group. "X" can range widely depending on desired use.

In a 500 mL, three-necked, round-bottomed flask fitted with a mechanical stirrer, nitrogen inlet, and addition funnel, 10.00 g (0.0226 mol of polymer repeat unit) of polysulfone (commercial Udel P-3500 polysulfone) was dissolved in 200 mL of anhydrous tetrahydrofuran with stirring. The solution was cooled to −50° C. with the aid of a carbon dioxide/acetone bath. With vigorous stirring, 4.52 mL (0.0113 mol) of 2.5 M n-butyllithium in mixed hexanes was added over a 5 minute period. The solution turned from a clear, light yellow colored solution to a deep brownish-red colored solution. After 30 minute, 2.25 g (0.0125 mol) of 9-fluorenone was added. The cooling bath was removed and the solution was gradually warmed to 20° C. over 30 minutes. After maintaining the reaction mixture at this temperature for 2 hr. with stirring, the reaction mixture was poured into a mixture of 600 mL of isopropanol and 300 mL of water, and 20 mL of acetic acid. After isolation of the precipitate and drying the precipitate in a vacuum oven set at 80° C., isolated 9.61 g of polysulfone polymer bearing 9-(9-hydroxyfluorenyl) groups ortho to the sulfone moiety of the polymer. NMR analysis of the polymer revealed that there were 0.30 grafts per polymer repeat unit where the graft was the 9-(9-hydroxyfluorenyl) group.

EXAMPLE 4
Grafting Benzophenone onto the Poly(arylene ether) Prepared in Example 1

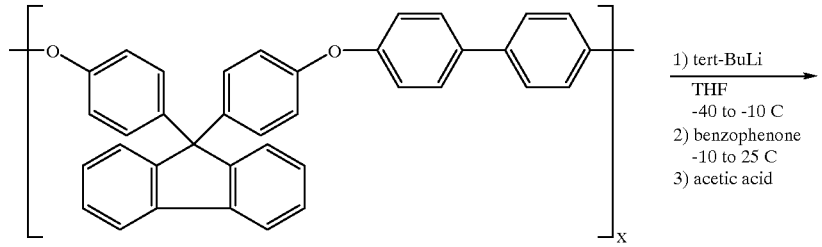

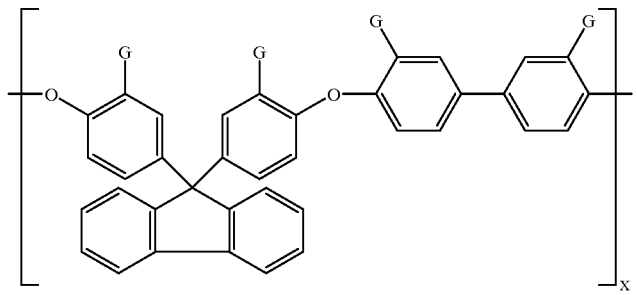

G = H or Graft where Graft = 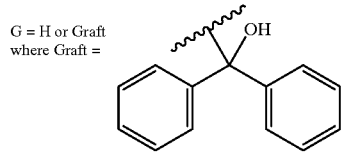

In a 500 mL, three-necked, round-bottomed flask fitted with a mechanical stirrer, nitrogen inlet, and addition funnel, 20.00 g (0.040 mol of polymer repeat unit) of the poly(arylene ether) prepared in Example 1 was dissolved in 300 mL of anhydrous tetrahydrofuran with stirring. The solution was cooled to −40° C. with the aid of a carbon dioxide/acetone bath. With vigorous stirring, 20 mL (0.034 mol) of 1.7 M tert-butyllithium in pentane was added over a 5–15 minute period. The solution turned from a clear, light yellow colored solution to a deep red colored solution. The cooling bath was removed and the solution was allowed to warm to −10° C. A 3.00 g (0.0165 mol) portion of benzophenone was added. The cooling bath was removed and the solution was gradually warmed to 20° C. over 30 minutes. After maintaining the reaction mixture at this temperature for 17 hr. with stirring 10 mL of acetic acid was added. The light green solution was filtered the precipitated in 1000 mL of methanol. After drying the polymer precipitate in a vacuum oven set at 80° C., isolated 19.65 g of poly(arylene ether) polymer bearing diphenylhydroxymethyl groups ortho to the ether links in the polymer. NMR analysis of the polymer revealed that there were 0.195 grafts per polymer repeat unit where the graft was the diphenylhydroxymethyl group. "X" can vary widely.

EXAMPLE 5

Grafting 9-Fluorenone onto the Poly(arylene ether) Prepared in Example 1

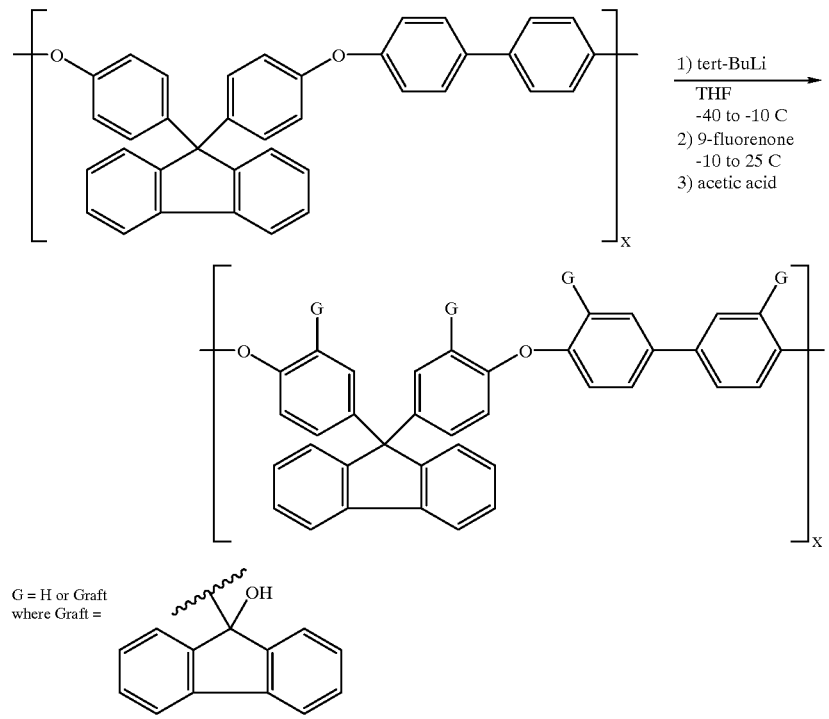

The procedure of Example 4 was followed except that 9-fluorenone was used instead of benzophenone. Therefore, the graft placed on the poly(arylene ether) was the 9-(9-hydroxyfluorenyl) group. "X" can vary widely based upon intended use.

In a 500 mL, three-necked, round-bottomed flask fitted with a mechanical stirrer, nitrogen inlet, and addition funnel, 20.00 g (0.040 mol of polymer repeat unit) of the poly (arylene ether) prepared in Example 1 was dissolved in 200 mL of anhydrous tetrahydrofuran with stirring. The solution was cooled to −40° C. with the aid of a carbon dioxide/ acetone bath. With vigorous stirring, 20 mL (0.034 mol) of 1.7 M tert-butyllithium in pentane was added over a 5–15 minute period. The solution turned from a clear, light yellow colored solution to a deep red colored solution. The cooling bath was removed and the solution was allowed to warm to −10° C. A 4.00 g (0.0222 mol) portion of 9-fluorenone was added. The cooling bath was removed and the solution was gradually warmed to 20° C. over 30 minutes. After maintaining the reaction mixture at this temperature for 17 hr. with stirring 10 mL of acetic acid was added. The light green solution was filtered the precipitated in 1000 mL of methanol. After drying the polymer precipitate in a vacuum oven set at 80° C., isolated 20.00 g of poly(arylene ether) polymer bearing 9-(9-hydroxyfluorenyl) groups ortho to the ether links in the polymer. NMR analysis of the polymer revealed that there were 0.370 grafts per polymer repeat unit where the graft was the 9-(9-hydroxyfluorenyl) group.

EXAMPLE 6
Grafting 9-Fluorenone onto the Poly(arylene ether) Prepared in Example 1

The procedure of Example 5 was followed except that larger amounts of both tert-butyllithium and 9-fluorenone were used. Therefore, the amount of graft per polymer repeat unit was increased. "X" can vary widely based upon the intended use.

In a 500 mL, three-necked, round-bottomed flask fitted with a mechanical stirrer, nitrogen inlet, and addition funnel, 20.00 g (0.040 mol of polymer repeat unit) of the poly (arylene ether) prepared in Example 1 was dissolved in 300 mL of anhydrous tetrahydrofuran with stirring. The solution was cooled to −40° C. with the aid of a carbon dioxide/ acetone bath. With vigorous stirring, 25 mL (0.045 mol) of 1.7 M tert-butyllithium in pentane was added over a 5–15 minute period. The solution turned from a clear, light yellow colored solution to a deep red colored solution. The cooling bath was removed and the solution was allowed to warm to −10° C. A 8.00 g (0.0444 mol) portion of 9-fluorenone was added. The cooling bath was removed and the solution was gradually warmed to 20° C. over 30 minutes. After maintaining the reaction mixture at this temperature for 17 hr. with stirring 25 mL of acetic acid was added. The light green solution was filtered the precipitated in 1000 mL of methanol. After drying the polymer precipitate in a vacuum oven set at 80° C., isolated 25.00 g of poly(arylene ether) polymer bearing 9-(9-hydroxyfluorenyl) groups ortho to the ether links in the polymer. NMR analysis of the polymer revealed that there were 0.881 grafts per polymer repeat unit where the graft was the 9-(9-hydroxyfluorenyl) group.

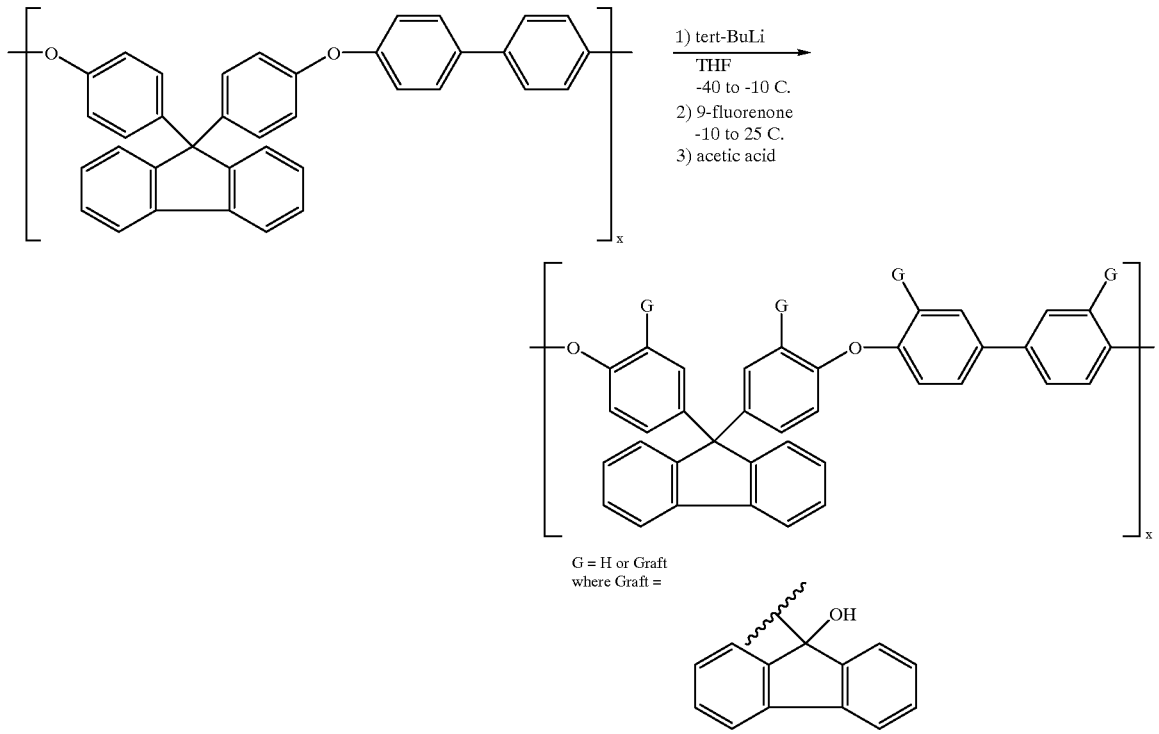

EXAMPLE 7
Grafting 4,4'-dimethoxybenzophenone onto a Poly(arylene ether) Prepared in Example 1

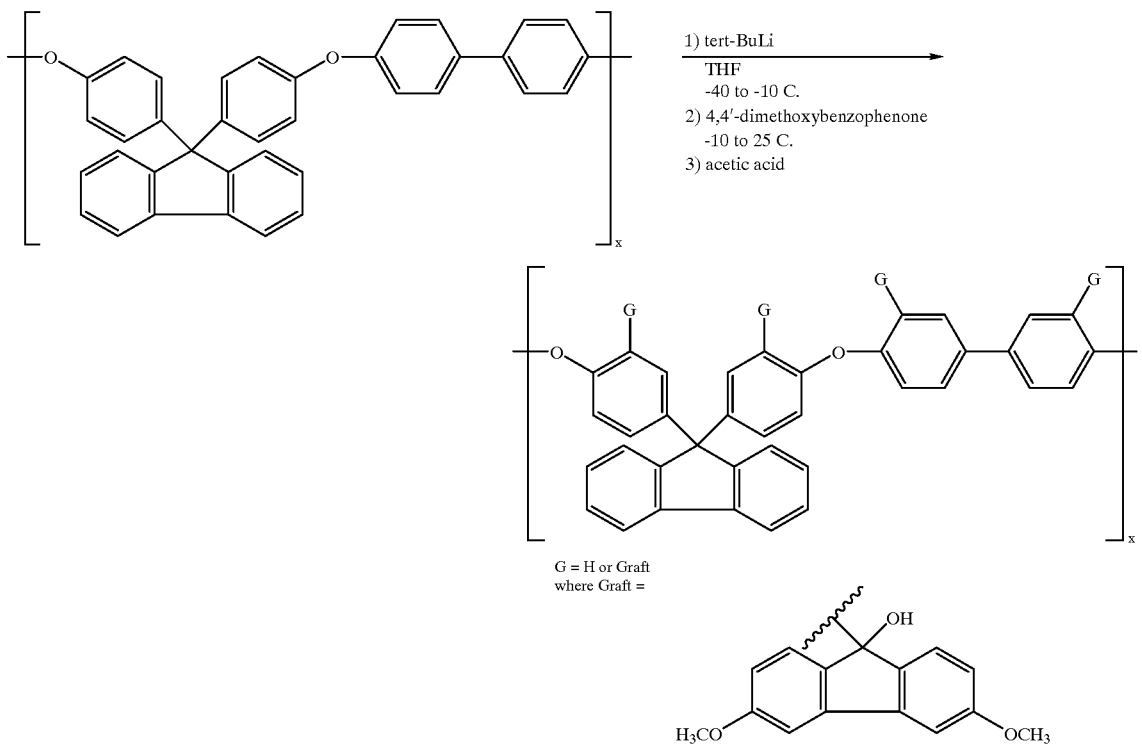

The procedure of Example 4 was followed except that 4,4'-dimethoxybenzophenone was used instead of benzophenone. Therefore, the graft placed on the poly(arylene ether) was the di(4-methoxyphenyl)hydroxylmethyl group.

In a 500 mL, three-necked, round-bottomed flask fitted with a mechanical stirrer, nitrogen inlet, and addition funnel, 30.00 g (0.060 mol of polymer repeat unit) of the poly(arylene ether) prepared in Example 1 was dissolved in 200 mL of anhydrous tetrahydrofuran with stirring. The solution was cooled to −40° C. with the aid of a carbon dioxide/acetone bath. With vigorous stirring, 25 mL (0.0425 mol) of 1.7 M tert-butyllithium in pentane was added over a 5–15 minute period. The cooling bath was removed and the solution was allowed to warm to −10° C. A 5.00 g (0.0206 mol) portion of 4,4'-dimethoxybenzophenone was added. The cooling bath was removed and the solution was gradually warmed to 20° C. over 30 minutes. After maintaining the reaction mixture at this temperature for 17 hr. with stirring 10 mL of acetic acid was added. The light green solution was filtered the precipitated in 1000 mL of methanol. After drying the polymer precipitate in a vacuum oven set at 80° C., isolated 32.44 g of poly(arylene ether) polymer with di(4-methoxyphenyl)hydroxylmethyl groups ortho to the ether links in the polymer. NMR analysis of the polymer revealed that there were 0.266 grafts per polymer repeat unit where the graft was the di(4-methoxyphenyl) hydroxylmethyl group. "X" can vary widely dependent on the end use desired and the properties needed.

EXAMPLE 8
Grafting 3,3',4,4'-Tetramethoxybenzophenone onto the Poly (arylene ether) Prepared in Example 1

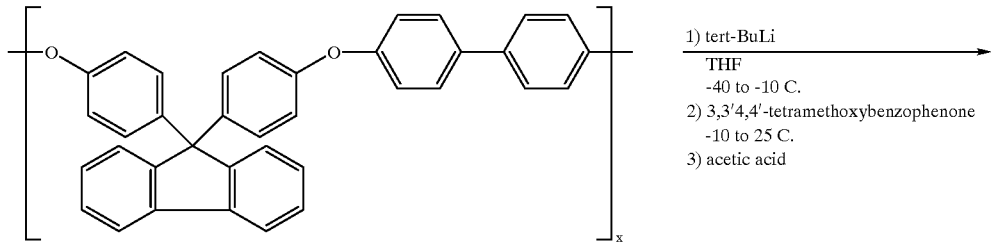

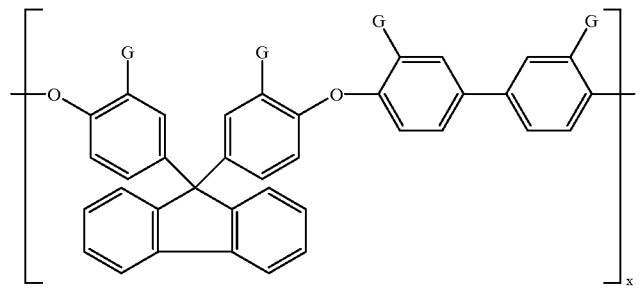

G = H or Graft
where Graft =

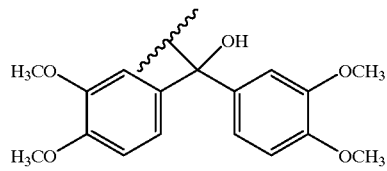

The procedure of Example 4 was followed except that 3,3',4,4'-tetramethoxybenzophenone was used instead of benzophenone. Therefore, the graft placed on the poly(arylene ether) was the bis(3,4-dimethoxyphenyl)hydroxylmethyl group. "X" can vary widely dependent on the desired properties of the end use.

In a 500 mL, three-necked, round-bottomed flask fitted with a mechanical stirrer, nitrogen inlet, and addition funnel, 20.00 g (0.040 mol of polymer repeat unit) of the poly(arylene ether) prepared in Example 1 was dissolved in 400 mL of anhydrous tetrahydrofuran with stirring. The solution was cooled to −40° C. with the aid of a carbon dioxide/acetone bath. With vigorous stirring, 20 mL (0.034 mol) of 1.7 M tert-butyllithium in pentane was added over a 5–15 minute period. The cooling bath was removed and the solution was allowed to warm to −10° C. A 6.00 g (0.020 mol) portion of 3,3',4,4'-tetramethoxybenzophenone was added. The cooling bath was removed and the solution was gradually warmed to 20° C. over 30 minutes. After maintaining the reaction mixture at this temperature for 17 hr. with stirring 10 mL of acetic acid was added. The light green solution was filtered the precipitated in 1000 mL of methanol. After drying the polymer precipitate in a vacuum oven set at 80° C., isolated 22.5 g of poly(arylene ether) polymer bis(3,4-dimethoxyphenyl)hydroxylmethyl groups ortho to the ether links in the polymer. NMR analysis of the polymer revealed that there were 0.321 grafts per polymer repeat unit where the graft was the bis(3,4-dimethoxyphenyl)hydroxylmethyl group.

EXAMPLE 9

Crosslinking Results Obtained with No Graft and with Inappropriate Grafts on the Poly(arylene ether) Prepared in Example 1.—Baseline and Comparative (Negative) Data Films (30 micron thick) were prepared with poly(arylene ether) polymers bearing grafted crosslinking agent, as shown in Table 2. These films were prepared by dissolving the polymer in either tetrahydrofuran or cyclohexanone at 20 wt % concentration; allowing the solutions cast on a glass plate to slowly dry (1–2 days at room temperature, then lifting the films from the glass plate. The free-standing films were further dried by heating in an oven at 100° C. for 24 hr then at 200° C. for 24 hr. Each film was then cured under the conditions indicated in Table 2. After cure, the dynamic mechanical properties (glass transition temperature, Tg, as determined by tan delta and elastic modulus, E' at 400° C.) of each film were determined.

TABLE 2

Thermally Cured Films of Poly(arylene ether)s Bearing No Graft or Bearing Thermally Unstable, Grafted Crosslinking Agents.

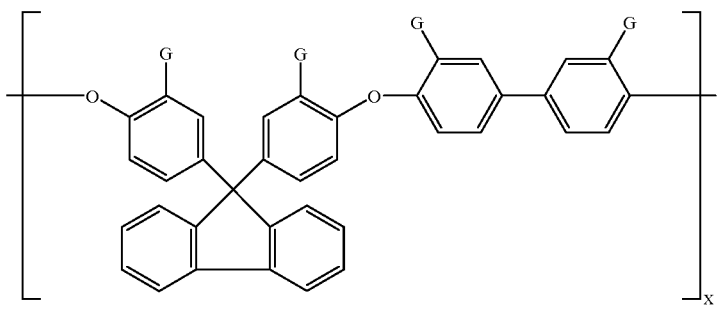

G = H or Graft
Z = Number of Grafts per Polymer Repeat Unit (maximum of Z = 4.00)

| Graft (G) | Z | Cure Atmosphere - Air | Cure Atmosphere - N2 |
|---|---|---|---|
| None (—H) | 0.00 | Cure: 400° C. for 1 hr. Tg 291° C. E'(@400° C.) = 2.7 e7 dynes/cm² Crosslinked | Cure: 400° C. for 1 hr. Tg 275° C. Not crosslinked; Polymer remained thermoplastic. |
| ⸺C(CH₃)₂OH | 0.050 | ND | Cure: 425° C. for 1 hr. Tg: 284° C. E'(@400° C.) = 1.79 e5 dynes/cm² Crosslinked; however; some polymer decomposition occurred during cure. |
| ⸺C(cyclohexyl)OH | 0.094 | ND | Cure: 425° C. for 1 hr. Polymer decomposed to powder during cure. A cured film fit for dynamic mechanical analysis could not be obtained. |

ND = No data

As can be seen from this data, heating the poly(arylene ether) polymer with no grafted crosslinker in nitrogen at 400° C. results in no crosslinking. There is no measurable elastic modulus, E', at 400° C.; the polymer remains thermoplastic. Heating in air at 400° C. results in crosslinking. An increase in Tg is observed as well as a measurable elastic modulus at 400° C. This represents the base case for this invention.

When the grafted crosslinkers, shown in Table 2, are present on the backbone of the poly(arylene ether), the results of thermal cure in either nitrogen or air are poor. This is due to the fact that the grafted crosslinkers contain aliphatic groups (two methyls or a cyclohexyl) and these groups are not thermally stable at cure temperatures of >400° C., whether in air or nitrogen.

EXAMPLE 10

Crosslinking Results Obtained with Appropriate Grafts Present on the Poly(arylene ether) Prepared in Example 1

Utilizing the same procedure described in Example 7, films (30 micron thick) were prepared with poly(arylene ether) polymers bearing grafted crosslinking agent, as shown in Table 3.

TABLE 3

Thermally Cured Films of Poly(arylene ether)s Bearing Thermally Stable Crosslinking Agents.

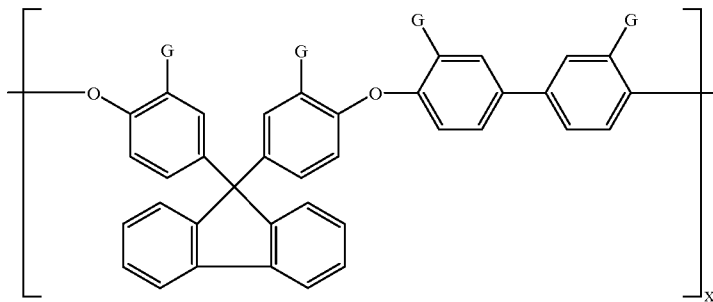

G = H or Graft
Z = Number of Grafts per Polymer Repeat Unit (maximum of Z = 4.00)

| Graft (G) | Z | Cure Atmosphere - Air | Cure Atmosphere - N2 |
|---|---|---|---|
| [structure: C(OH)(phenyl)(phenyl)] | 0.162 | ND | Cure: 425° C. for 1 hr. Tg: 280° C. E'(400° C.): 4.36 e6 dynes/cm$^2$ Crosslinked |
| [structure: 9-hydroxyfluorenyl] | 0.123 | ND | Cure: 425° C. for 1 hr. Tg: 288° C. E'(400° C.): 5.26 e6 dynes/cm$^2$ Crosslinked |
|  | 0.248 | ND | Cure: 425° C. for 1 hr. Tg: 292° C. E'(400° C.): 5.50 e6 dynes/cm$^2$ Crosslinked |
|  | 0.881 | ND | Cure: 425° C. for 1 hr. Tg: 366° C. E'(400° C.): 1.09 e8 dynes/cm$^2$ Crosslinked |
| [structure: C(OH)(4-methoxyphenyl)$_2$] | 0.072 | ND | Cure: 425° C. for 1 hr. Tg: 285° C. E'(400° C.): 2.03 e7 dynes/cm$^2$ Crosslinked |
|  | 0.144 | Cure: 400° C. for 1 hr. Tg: 435° C. E'(400° C.): 6.48 e9 dynes/cm$^2$ Crosslinked | ND |
|  | 0.519 | ND | Cure: 435° C. for 1 hr. Tg: 383° C. E'(400° C.): 3.36 e8 dynes/cm$^2$ Crosslinked |
| [structure: C(OH)(3,4-dimethoxyphenyl)$_2$] | 0.321 | Cure: 350° C. for 0.5 hr Tg: 430° C. E'(400° C.): 3.64 e9 dynes/cm$^2$ Crosslinked | Cure: 425° C. for 1 hr. Tg: 307° C. E'(400° C.): 1.72 e8 dynes/cm$^2$ Crosslinked |

TABLE 3-continued

Thermally Cured Films of Poly(arylene ether)s Bearing Thermally Stable Crosslinking Agents.

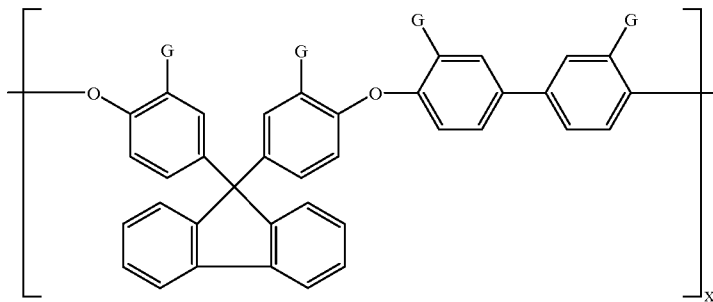

G = H or Graft
Z = Number of Grafts per Polymer Repeat Unit (maximum of Z = 4.00)

| Graft (G) | Z | Cure Atmosphere - Air | Cure Atmosphere - N2 |
|---|---|---|---|
|  | 0.400 | ND | Cure: 425° C. for 1 hr.<br>Tg: 360° C.<br>E'(400° C.): 5.10 e8 dynes/cm$^2$<br>Crosslinked |

ND = No data

As can be seen from the data in Table 3, heating the poly(arylene ether) polymer with thermally stable, grafted crosslinker in air or nitrogen at >400° C. results in good crosslinking results. There is a measurable increase in the elastic modulus, E', at 400° C.; as compared to the base case (graft=H in Example 7). Also an increase in Tg is observed as well. These types of "diaryl grafts" represent the basis of this invention.

EXAMPLE 11

Thermal Stability of Thermally Cured Poly(arylene ether) Bearing the Bis(3,4-dimethoxyphenyl)hydroxymethyl Graft Poly(arylene ether)s bearing the bis(3,4-dimethoxyphenyl)hydroxymethyl graft at two different concentrations were thermally cured in nitrogen at the temperatures and times indicated in Table 4. The thermal stability of each sample was determined by measuring the rate of weight loss at the temperature of cure.

TABLE 4

Thermal Stability of Thermally Cured Poly(arylene ether) Bearing the Bis(3,4-dimethoxyphenyl)hydroxymethyl Graft at Two Different Levels of Graft.

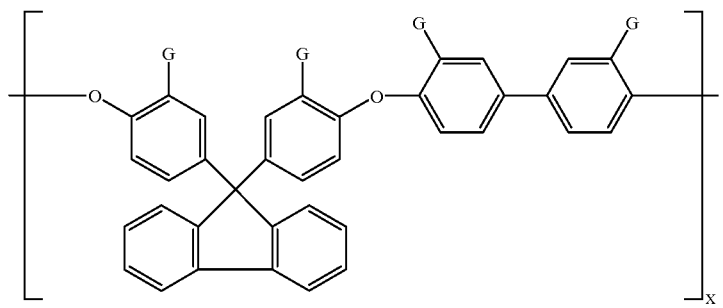

G = H or Graft
where Graft =

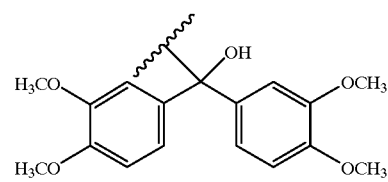

Z = Number of Grafts per Polymer Repeat Unit (maximum of Z = 4.00)

| Z | Temperature of Cure (° C.) | Time of Cure (min.) | Rate of Weight Loss After Cure is Complete (wt %/hr at Temperature indicated.) |
|---|---|---|---|
| 0.25 | 390 | 40 | 0.54 (@390° C.) |
| 0.25 | 400 | 30 | 0.69 (@400° C.) |
| 0.25 | 410 | 20 | 0.80 (@410° C.) |
| 0.25 | 420 | 20 | 0.91 (@420° C.) |
| 0.42 | 390 | 40 | 0.67 (@390° C.) |
| 0.42 | 400 | 30 | 0.86 (@400° C.) |
| 0.42 | 410 | 20 | 1.48 (@410° C.) |
| 0.42 | 420 | 20 | 1.70 (@420° C.) |

The results indicate that the crosslinks between the polymer chains are stable at elevated temperatures and that the thermal stability of the polymer has not been lost.

EXAMPLE 12

Thermal Stability of Thermally Cured Poly(arylene ether) Bearing the 9-(9-Hydroxyfluorenyl) Graft A poly(arylene ether) bearing the 9-(9-hydroxyfluorenyl) graft was thermally cured in nitrogen at the temperatures and times indicated in Table 5. The thermal stability of each sample was determined by measuring the rate of weight loss at the temperature of cure.

The grafted polymers of the present invention, specifically in their crosslinked form, can be used as coatings, layers, encapsulants, barrier regions or barrier layers or substrates in microelectronic devices. These devices may include, but are not limited to multichip modules, integrated circuits, conductive layers in integrated circuits, conductors in circuit patterns of an integrated circuit, circuit boards, as well as similar or analogous electronic structures requiring insulating or dielectric regions or layers.

The grafted polymers of the present invention may be used in a multichip module wherein a substrate typically made of silicon, glass or ceramic supports high density,

TABLE 5

Thermal Stability of Thermally Cured Poly(arylene ether) the 9-(9-Hydroxyfluorenyl) Graft

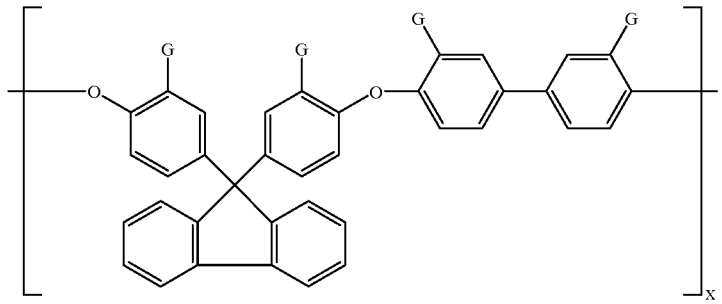

G = H or Graft
where Graft =

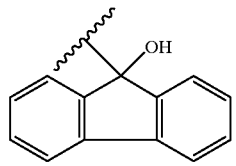

Z = Number of Grafts per Polymer Repeat Unit (maximum of Z = 4.00)

| Z | Temperature of Cure (° C.) | Time of Cure (min.) | Rate of Weight Loss After Cure is Complete (wt %/hr at Temperature indicated.) |
|---|---|---|---|
| 0.88 | 400 | 30 | 0.42 (@400° C.) |
| 0.88 | 410 | 30 | 0.40 (@410° C.) |
| 0.88 | 420 | 20 | 0.48 (@420° C.) |
| 0.88 | 430 | 20 | 0.58 (@430° C.) |

The results indicate that the crosslinks between the polymer chains are stable at elevated temperatures and that the thermal stability of the polymer has not been lost.

multilayer interconnects in which the dielectric material providing insulation between the various layers contains the polymer of the present invention. On the interconnects are mounted semiconductor chips or integrated circuits which are connected to each other by electrical conductors in the interconnect. The substrate may also contain electrical conductors, for example, for power and ground. Lead frames provide connections to external circuitry. In such multilayer interconnects, layers of electrical connections are separated from each other by the dielectric materials containing the polymers of the present invention. The grafted polymers of the present invention can also separate various regions of conductors, such as between various discrete conductors in a common layer. A via can provide connection between the various layers as necessary. The interconnect is connected to an integrated circuit chip by a bond pad. The via can be in a stacked pillar design, although other designs conventional in the art, such as stair-stepped or nested via designs, can be used. Other multichip module designs in which the polymers of the present invention dielectric material can be used are known in the prior art.

The grafted polymers of the present invention, more specifically in their crosslinked form, can also be used as interlayer dielectrics in an interconnect associated with a single integrated circuit chip. An integrated circuit chip would typically have on its surface plural layers of the crosslinked, grafted polymer dielectric and multiple layers of metal conductors. It can also include regions of the crosslinked, grafted poly(arylene ether) dielectric between discrete metal conductors or regions of conductor in the same layer or level of an integrated circuit. The grafted polymer can also be used in conjunction with conventional silicon, where the grafted polymer is used between the metal lines on a layer with silicon used as the dielectric material between layers of conductor material.

The grafted polymer of the present invention can further be used as protective coatings on integrated circuit chips for protection against alpha particles. Semiconductor devices are susceptible to soft errors when alpha particles emitted from radioactive trace contaminants in the packaging or other nearby materials strike the active surface. An integrated circuit can be provided with a protective coating of the grafted polymer of the present invention. Typically, an integrated circuit chip would be mounted on a substrate and held in place with an appropriate adhesive. A coating of the grafted polymers of the present invention provides an alpha particle protection layer for the active surface of the chip. Optionally, additional protection is provided by encapsulant made of, for example, epoxy or a silicone.

The grafted polymers of the present invention, preferably in their crosslinked form, can also be used as a substrate (dielectric material) in circuit boards or printed wiring boards. The circuit board made up of the grafted polymer of the present invention has mounted on its surface patterns for various electrical conductor circuits. The circuit board may include, in addition to the grafted polymers of the present invention, various reinforcements, such as woven nonconducting fibers, such as glass cloth. Such circuit boards may be single sided, as well as double sided or multilayer.

Films or coatings of the grafted polymers of the present invention can be formed by solution techniques such as spraying, spin coating or casting, with spin coating being preferred. Preferred solvents are 2-ethoxyethyl ether, cyclohexanone, cyclopentanone, toluene, xylene, chlorobenzene, N-methyl pyrrolidinone, N,N-dimethylformamide, N,N-dimethylacetamide, methyl isobutyl ketone, 2-methoxyethyl ether, 5-methyl-2-hexanone, γ-butyrolactone, and mixtures thereof. Typically, the coating thickness is between about 0.1 to about 15 microns. As a dielectric interlayer, the film thickness is less than 2 microns.

Additives can be used to enhance or impart particular target properties, as is conventionally known in the polymer art, including stabilizers, flame retardants, pigments, plasticizers, surfactants, and the like. Compatible or non-compatible polymers can be blended in to give a desired property.

Adhesion promoters can also be used to adhere the grafted polymers of the present invention dielectric material to the appropriate substrates. Such promoters are typified by hexamethyldisilazane, which can be used to interact with available hydroxyl functionality that may be present on a surface, such as silicon dioxide, which has been exposed to moisture or humidity that creates such hydroxyl functionality.

The polymers of the present invention can be used in blends of other polymers to achieve desired results. Polymer molecular weight or chain length can be varied to achieve the specific properties desired for a particular end use application.

The present invention has been shown to overcome the problems in the prior art for a low dielectric polymer with high glass transition temperature, low reactivity, dimensional stability, superior adhesion and high crosslink density, which is particularly useful for interlayer dielectric layers for very large scale integrated circuits where dielectric constants of the required dielectric layer are increasingly more stringent, along with the other physical properties of the dielectric layer. The present invention provides surprising and unexpectedly enhanced properties in this demanding end use application to solve a significant problem of the next generation interlayer dielectric layer as the electronic fabrication industry moves to ever decreasing line widths, feature dimensions and layers of circuitry on a single integrated circuit or computer chip.

The present invention has been set forth with regard to several preferred embodiments, however the full scope of the present invention should be ascertained from the claims which follow.

I claim:

1. A composition comprising a poly(arylene ether) polymer having a graft which graft can be thermally induced to crosslink the polymer, wherein said polymer having said graft has the structure:

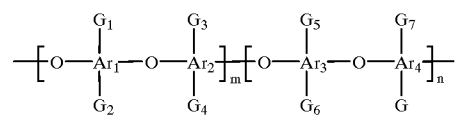

wherein m=0 to 1.0; and n=1.0−m; and $Ar_1$, $Ar_2$, $Ar_3$ and $Ar_4$ are individually arylene radicals, and $G_{1-8}$ are individually: H,

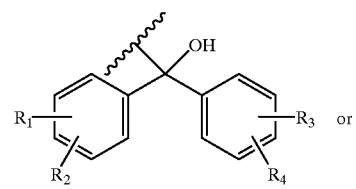

I

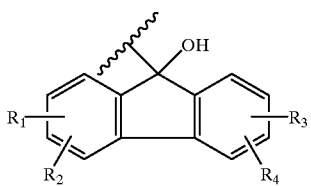

or mixtures thereof, wherein Z is the average number of G radicals which are I or II per repeating unit of said polymer and Z is in the range of 0.1 to 4.0, where $R_1$, $R_2$, $R_3$ and $R_4$ are individually H or alkoxy radical, wherein the alkoxy radical can have a normal or branched alkyl radical of $C_{1-8}$, and further wherein said poly(arylene ether) polymer consists essentially of non-functional repeating units wherein $Ar_1$, $Ar_2$, $Ar_3$ and $Ar_4$ are individually arylene radicals selected from the group consisting of;

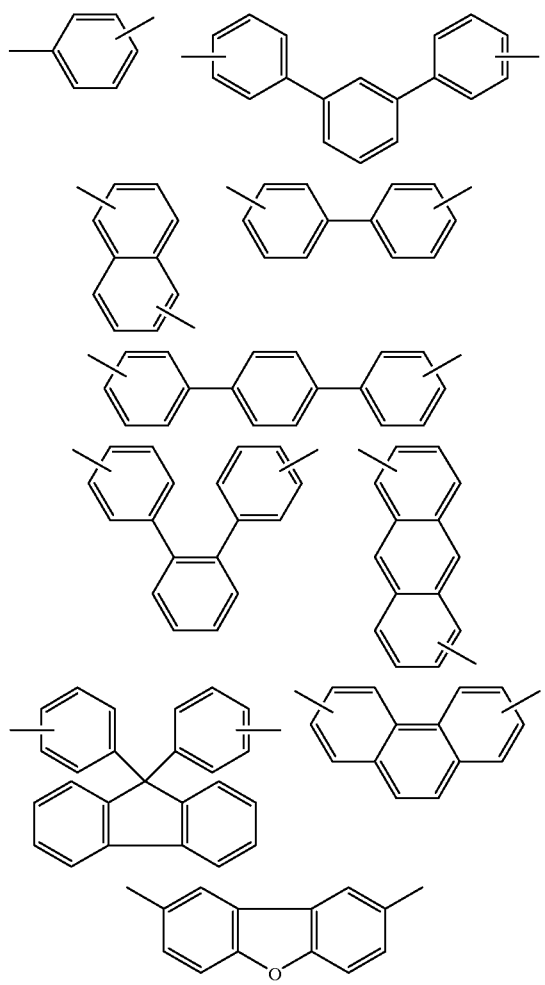

and mixtures thereof, but $Ar_1$ and $Ar_2$ or $Ar_3$ and $Ar_4$, other than the diradical 9,9-diphenylfluorene, are not isomeric equivalents.

2. The composition of claim 1 wherein the grafted polymer has repeating units of a structure:

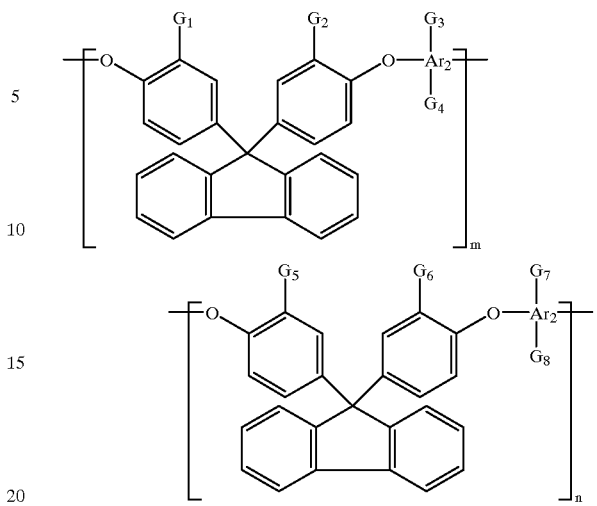

wherein $G_{1-8}$ are as defined above; m=0 to 1.0; and n=1.0–m; and $Ar_2$ and $Ar_4$ are individually arylene radicals selected from the group consisting of;

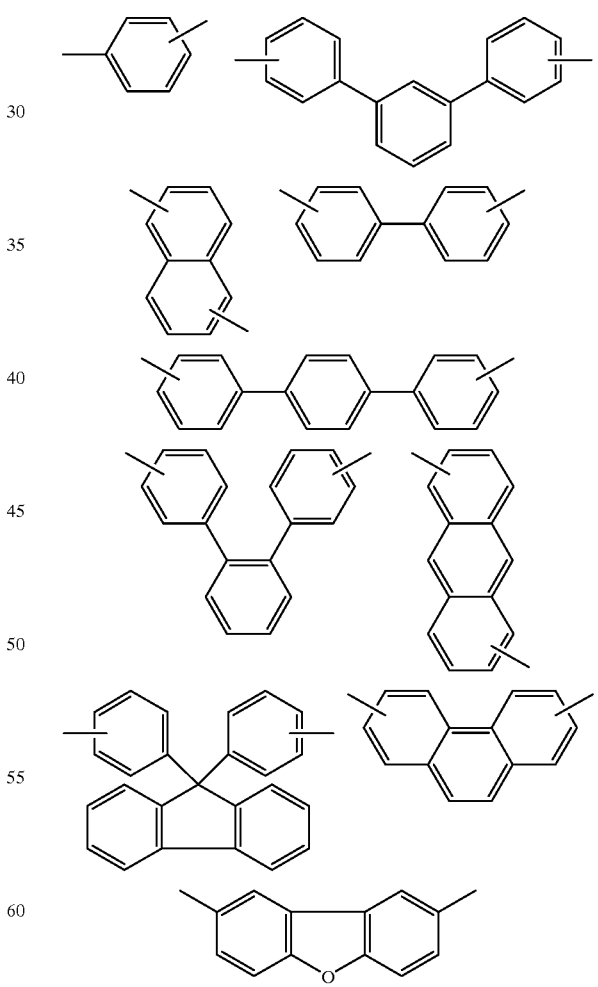

and mixtures thereof.

3. The composition of claim 2 wherein the grafted polymer comprises a repeating polymer unit:

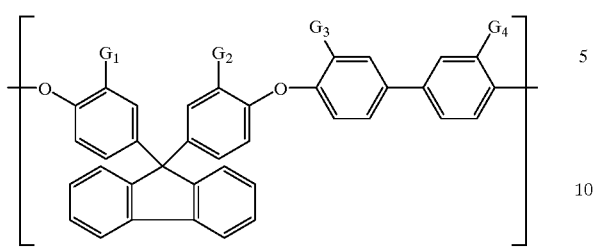
wherein grafts $G_{1-4}$ are individually selected from the group consisting of: H,
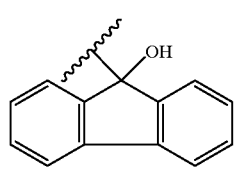
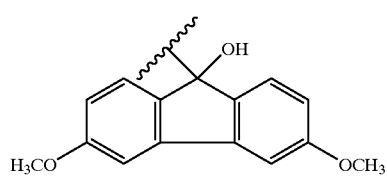
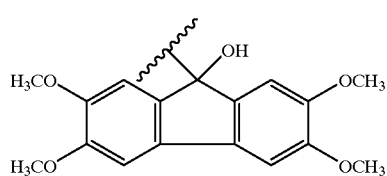
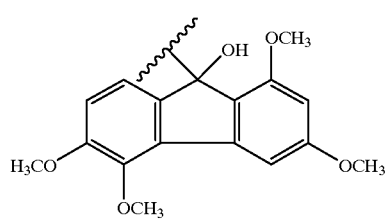
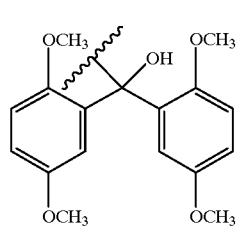
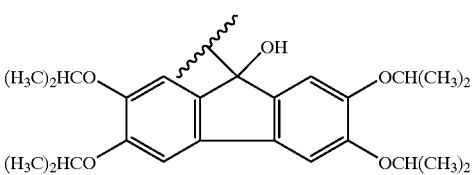
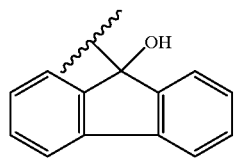
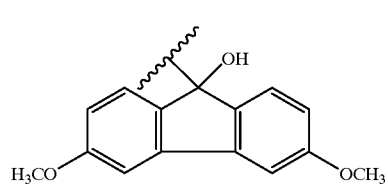
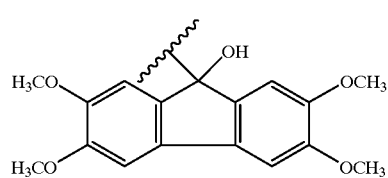
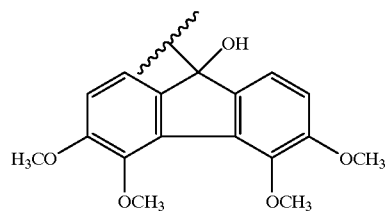
and mixtures thereof, where Z is the average number of G radicals per polymer unit and Z is in the range of 0.1 to 4.0.
4. The composition of claim 1 wherein the grafted polymer has a repeating polymer unit:

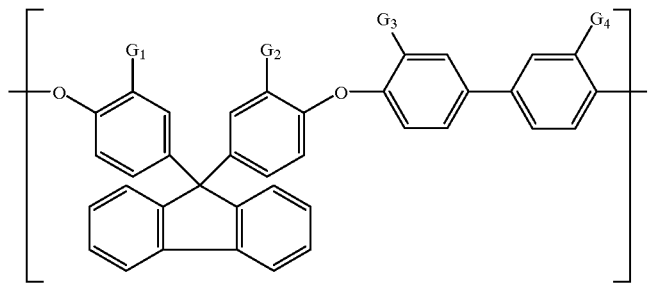

wherein $G_{1-4}$ are individually H or:

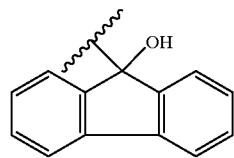

III where Z is the average number of G radicals per polymer unit and Z is in the range of 0.1 to 4.0.

5. The composition of claim 4 wherein Z is in the range of 0.25 to 1.5.

6. The composition of claim 5 wherein Z is approximately 0.9.

7. The composition of claim 1 wherein said composition is crosslinked and comprises a dielectric material on a microelectronic device.

8. The composition of claim 7 wherein said dielectric material is provided adjacent conductive regions of an integrated circuit.

9. The composition of claim 1 wherein said polymer and said graft are crosslinked.

10. A method of crosslinking an aromatic polymer having a graft bonded to said aromatic polymer comprising heating said aromatic polymer having a graft bonded to said aromatic polymer to a temperature in the range of 200° C. to 450° C. in an inert atmosphere, and thermally inducing said aromatic polymer to crosslink, wherein the graft is selected from the group consisting of:

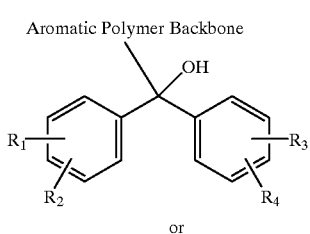

I or

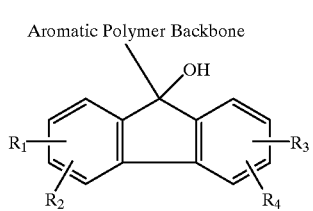

II or mixtures thereof, where $R_1$, $R_2$, $R_3$ and $R_4$ are individually H or alkoxy radical, wherein the alkoxy radical can have a normal or branched alkyl radical of $C_{1-8}$.

11. The method of claim 10 wherein said graft is selected from the group consisting of:

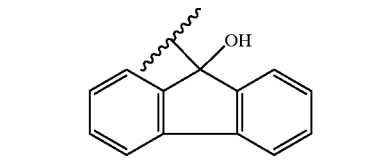

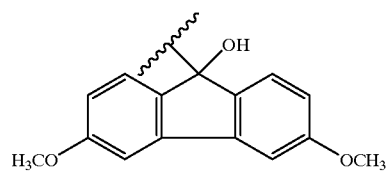

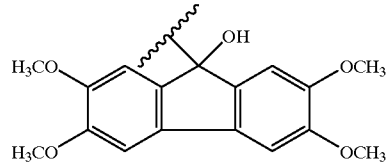

-continued

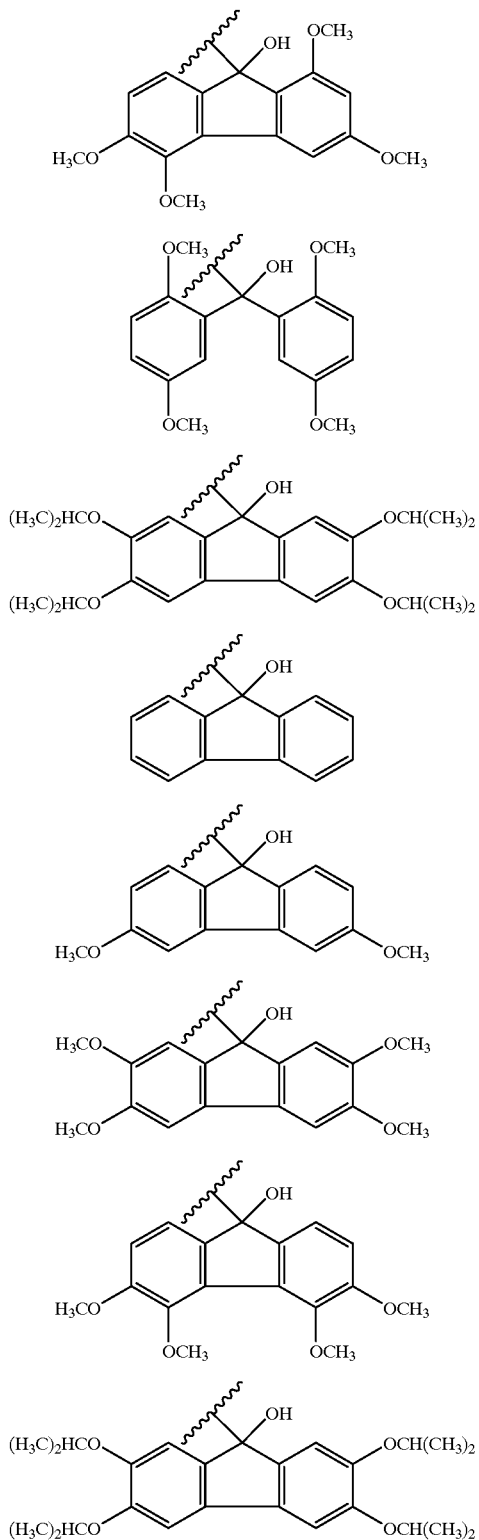

and mixtures thereof.

12. The method of claim 10 wherein said aromatic polymer is selected from the group consisting of poly(arylene ethers), aromatic polysulfones, aromatic polyimides, aromatic polyamides, aromatic polyquinolines and mixtures thereof.

13. The method of claim 10 wherein said temperature is in the range of 300° C. to 450° C.

14. The method of claim 10 wherein said temperature is approximately 425° C.

15. A method of synthesizing a graft aromatic polymer comprising contacting a poly(arylene ether) polymer with tertiary alkyl lithium in an appropriate solvent at a temperature in the range of −40° C. to −10° C. and adding a ketone at a temperature in the range of −10° C. to 25° C., where the ketone is selected from the group consisting of:

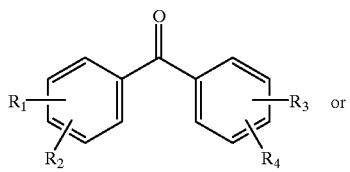

I

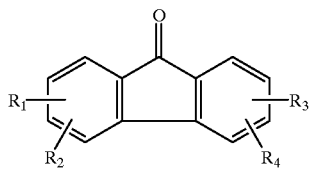

II or mixtures thereof, where $R_1$, $R_2$, $R_3$ and $R_4$ are individually H or alkoxy radicals, wherein the alkoxy radical is a normal or branched alkyl radical of $C_{1-8}$, and further wherein said poly(arylene ether) polymer consists essentially of non-functional repeating units wherein individual arylene radicals are selected from the group consisting of;

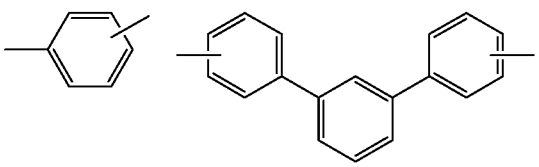
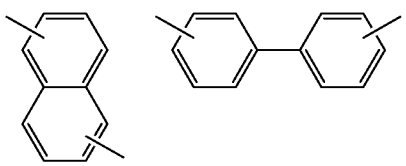
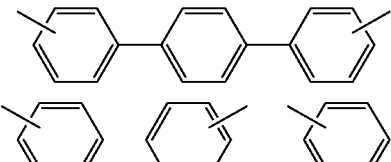
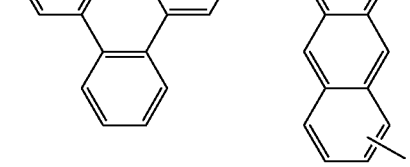

-continued

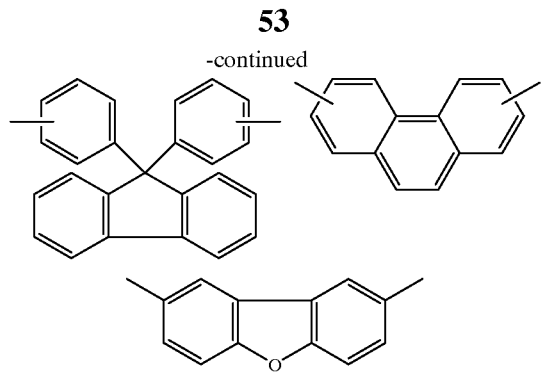

and mixtures thereof, but said individual arylene radicals, other than the diradical 9,9-diphenylfluorene, are not isomeric equivalents.

16. The method of claim 15 wherein said ketone is selected from the group consisting of:

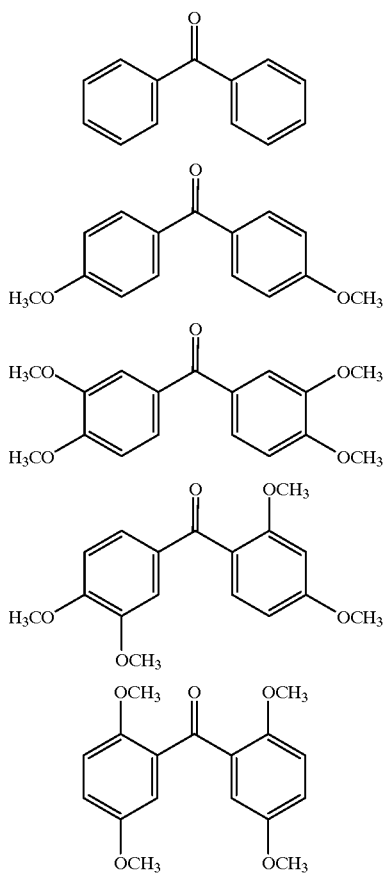

-continued

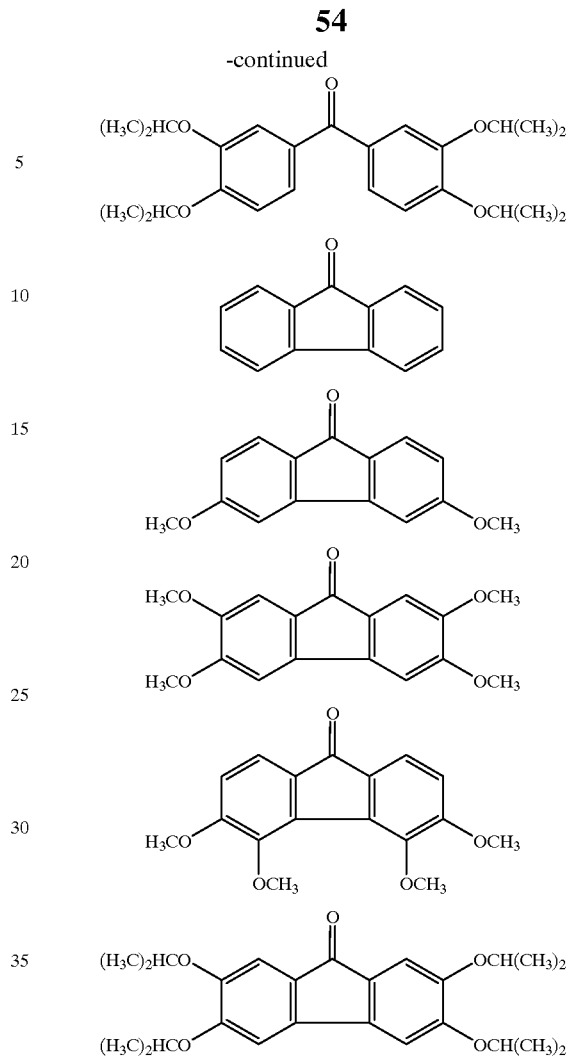

and mixtures thereof.

17. The method of claim 15 wherein after the addition of the ketone the mixture is acidified and the grafted polymer is recovered.

18. The method of claim 15 wherein said tertiary alkyl lithium is tert-butyllithium.

19. The method of claim 15 wherein said solvent is selected from the group consisting of tetrahydrofuran, glyme, ethyl ether, butyl ethyl ether, tert-butyl methyl ether, 2-methoxyethyl ether, di(ethylene glycol)diethyl ether and mixtures thereof.

* * * * *

UNITED STATES PATENT AND TRADEMARK OFFICE
CERTIFICATE OF CORRECTION

PATENT NO. : 6,060,170
DATED : May 9, 2000
INVENTOR(S) : William Franklin Burgoyne, Jr.

It is certified that error appears in the above-identified patent and that said Letters Patent is hereby corrected as shown below:

At each of the following places:
Column 6, lines 5-29,
Column 9, lines 25-50,
Column 47, lines 25-50,
Delete the single bond between the two aromatic rings in the formulae. The formulae should appear as shown below:

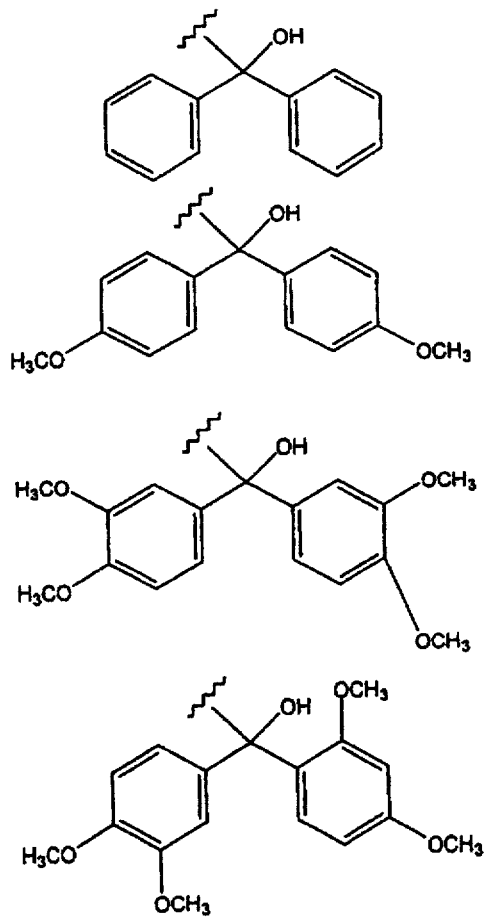

UNITED STATES PATENT AND TRADEMARK OFFICE
CERTIFICATE OF CORRECTION

PATENT NO.   : 6,060,170
DATED        : May 9, 2000
INVENTOR(S)  : William Franklin Burgoyne, Jr.

It is certified that error appears in the above-identified patent and that said Letters Patent is hereby corrected as shown below:

At each of the following places:
Column 6, line 40,
Column 9, lines 61-65,
Column 48, lines 5-10,
Delete the single bond between the aromatic rings in the formula. The formula should appear as shown below:

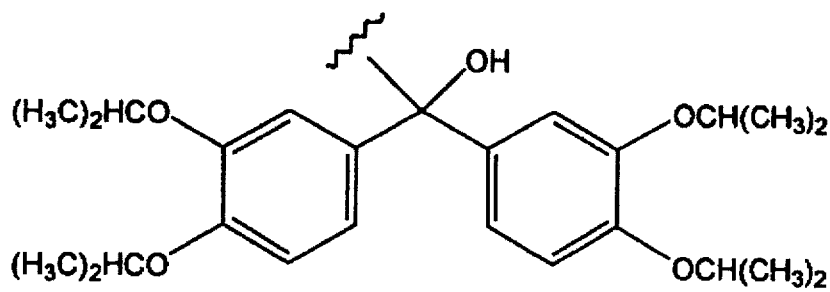

Column 44:
Line 50, cancel "G" and insert --$G_8$--therefor.

Column 46:
Line 12, cancel "$Ar_2$" which is connected to "$G_7$" and "$G_8$-" and insert --$Ar_4$--therefor.

UNITED STATES PATENT AND TRADEMARK OFFICE
CERTIFICATE OF CORRECTION

PATENT NO. : 6,060,170
DATED : May 9, 2000
INVENTOR(S) : William Franklin Burgoyne, Jr.

It is certified that error appears in the above-identified patent and that said Letters Patent is hereby corrected as shown below:

Column 50,
Lines 40-55,
Delete the single bond between the two aromatic rings in the formulae. The formulae should appear as shown below:

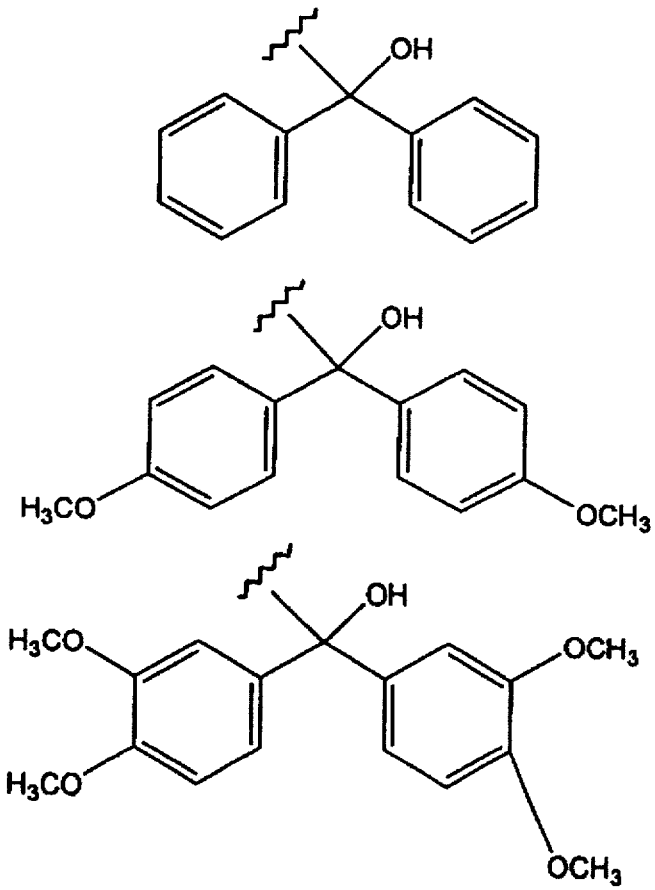

UNITED STATES PATENT AND TRADEMARK OFFICE
CERTIFICATE OF CORRECTION

PATENT NO. : 6,060,170
DATED : May 9, 2000
INVENTOR(S) : William Franklin Burgoyne, Jr.

It is certified that error appears in the above-identified patent and that said Letters Patent is hereby corrected as shown below:

Column 51,
Line 5, delete the single bond between the aromatic rings in the formula. The formula should appear shown below:

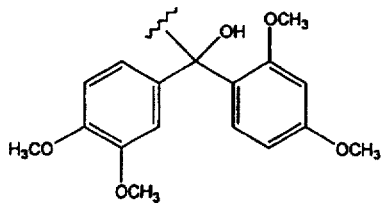

Column 51,
Lines 20-25, delete the single bond between the aromatic rings in the formula. The formula should appear as shown below:

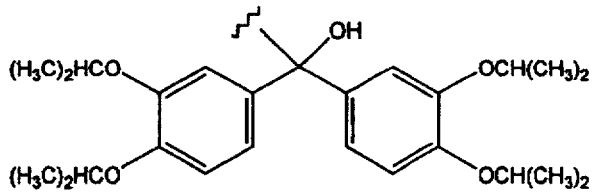

Signed and Sealed this

Seventh Day of August, 2001

*Attest:*

*Attesting Officer*

NICHOLAS P. GODICI
*Acting Director of the United States Patent and Trademark Office*